US007122432B2

(12) United States Patent
Shimizu et al.

(10) Patent No.: US 7,122,432 B2
(45) Date of Patent: Oct. 17, 2006

(54) NON-VOLATILE SEMICONDUCTOR MEMORY DEVICE AND MANUFACTURING METHOD THEREOF

(75) Inventors: Kazuhiro Shimizu, Yokohama (JP); Yuji Takeuchi, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 39 days.

(21) Appl. No.: 10/956,109

(22) Filed: Oct. 4, 2004

(65) Prior Publication Data

US 2005/0056895 A1    Mar. 17, 2005

Related U.S. Application Data

(62) Division of application No. 10/393,944, filed on Mar. 24, 2003, now Pat. No. 6,818,508, which is a division of application No. 09/651,021, filed on Aug. 30, 2000, now Pat. No. 6,555,427.

(30) Foreign Application Priority Data

Aug. 31, 1999  (JP) .................................. 11-246206
Mar. 31, 2000  (JP) .............................. 2000-099047

(51) Int. Cl.
   *H01L 21/336*  (2006.01)
(52) U.S. Cl. ...................... 438/266; 438/262; 438/264; 438/593; 438/594; 257/316; 257/321
(58) Field of Classification Search ................ 438/201, 438/211, 257–259, 262–264, 266, 591–594; 257/314–326
See application file for complete search history.

(56) References Cited

U.S. PATENT DOCUMENTS 5,612,914 A   3/1997  Liu et al.

(Continued)

FOREIGN PATENT DOCUMENTS

| JP | 11-87543 | 3/1999 |
|----|----------|--------|
| JP | 11-176961 | 7/1999 |
| JP | 11-176962 | 7/1999 |

OTHER PUBLICATIONS

S. Aritome, et al., "A 0.67um² Self-Aligned Shallow Trench Isolation Cell(SA-STI CELL) For 3V-only 256Mbit Nand Eeproms", IEDM, 1994,pp. 94-61-94-64.

*Primary Examiner*—Phat X. Cao
*Assistant Examiner*—Brian E. Kunzer
(74) *Attorney, Agent, or Firm*—Oblon, Spivak, McClelland, Maier & Neustadt, P.C.

(57) ABSTRACT

A non-volatile semiconductor memory device with a small variation in capacitance-coupling to the stacked gate for memory miniaturization. The device has a memory cell array in which memory cells are arranged in array. Each cell has a first gate and a second gate on a semiconductor substrate. The first gate is formed, via a first gate insulating film, on each of device forming regions isolated by device-isolating insulating films. The second gate is formed on the first gate via a second gate insulating film. The first gate is patterned so that its portion is overlapped on the isolation insulating film from the device forming region. A protective insulating film is provided on the isolation film between the device forming regions and in the vicinity of the first gate. A charge-storage layer of each memory cell has at least two stacked conductive layers with a small isolation width at a low aspect ratio for burying isolation insulating films for high density, to easily fabricate in low cost. The side face of the lowest conductive layer meets the side portion of the isolation region. The highest conductive layer has the same width as or is wider than the lowest conductive layer. The first conductive layer is thin for decrease in aspect ratio for burying the insulating film. The second conductive layer has a specific thickness for attaining a desired capacitance between it and the control gate. The highest layer may be formed in self-alignment with the isolation region and stretched out by isotropic-etching.

9 Claims, 37 Drawing Sheets

U.S. PATENT DOCUMENTS

| | | |
|---|---|---|
| 5,674,764 A | 10/1997 | Liu et al. |
| 5,959,888 A | 9/1999 | Araki et al. |
| 5,976,933 A | 11/1999 | Brambilla et al. |
| 6,049,482 A | 4/2000 | Aritome et al. |
| 6,222,225 B1 * | 4/2001 | Nakamura et al. .......... 257/315 |
| 6,235,583 B1 | 5/2001 | Kawata et al. |
| 6,323,085 B1 * | 11/2001 | Sandhu et al. .............. 438/257 |
| 6,329,688 B1 * | 12/2001 | Arai ........................... 257/320 |
| 6,342,715 B1 | 1/2002 | Shimizu et al. |

* cited by examiner

MEMORY CELL (WL DIRECTION)

MEMORY CELL (BL DIRECTION)

TRANSISTOR IN PERIPHERAL CIRCUIT (LOW VOLTAGE Tr)

(HIGH WITHSTND VOLTAGE Tr)

(LOW VOLTAGE Tr)

(HIGH WITHSTAND VOLTAGE Tr)

NON-VOLATILE SEMICONDUCTOR MEMORY DEVICE AND MANUFACTURING METHOD THEREOF

CROSS-REFERENCE TO RELATED APPLICATIONS

This application is a division of and claims the benefit of priority under 35 USC §120 from U.S. application Ser. No. 10/393,944, filed Mar. 24, 2003, now U.S. Pat. No. 6,818,508 which is a division of Ser. No. 09/651,021 filed Aug. 30, 2000 U.S. Pat. No. 6,555,427, issued Apr. 29, 2003 and is based upon and claims the benefit of priority under 35 USC §119 from Japanese Patent Applications Nos. 11-246206, filed Aug. 31, 1999 and 2000-099047, filed Mar. 31, 2000; the entire contents of each which are incorporated herein by reference.

BACKGROUND OF THE INVENTION

The present invention relates to a non-volatile semiconductor memory device having memory cells based on a stacked gate structure, and to a manufacturing method thereof.

What has hitherto been known as anon-volatile semiconductor memory (EEPROM (Electrically Erasable Programmable Read-Only Memory)) capable of electrically reprogramming data, is a flash memory using memory cells taking a MOS transistor structure based on a stacked structure of a charge-storage layer and a control gate.

FIG. 1 is a plan view showing a NOR type EEPROM using those memory cells. FIGS. 2A and 2B are sectional views taken along the lines A–A' and B–B', respectively, in FIG. 1.

Isolation insulating films 102 are buried into a memory cell array area on a silicon substrate 101, thereby defining device forming regions 103 continuous in a y-direction at a predetermined interval in an x-direction. Charge-storage layers 105 are provided via tunnel insulating films 104 on the substrate with the device being thus isolated, and a control gate 108 is provided via a gate-to-gate insulating film 107 on the charge-storage layers 105, thus configuring a memory cell. The charge-storage layer 105 is isolated by the isolation insulating film 102 and thus gets independent for every memory cell. The control gate 108 is continuously provided in the x-direction and serves as a word line common to a plurality of memory cells. The control gate 108 and the charge-storage layers 105 are formed in pattern in self-alignment manner so that the side ends thereof are aligned in the y-direction. Then, the control gate 108 is provided with an n-type diffused layer 6 in self-alignment. The memory cell is covered with an inter-layer insulating film 109, and bit lines 110 extending in the y-direction are arranged on the layer 109.

An execution of a data reprogramming process of the EEPROM involves applying a high electric field to between the substrate and the charge-storage layer, to allow a tunnel current to flow through between the charge-storage layer and the substrate, thus modulating a stored charge quantity of the charge-storage layer. A threshold level of the memory cell becomes higher with a larger quantity of negative charge existing within the charge-storage layer, whereas lower with a larger quantity of positive charge existing therein. Accordingly, electron injection into the charge-storage layer raises the threshold level (which may be, e.g., a programming state). On the contrary, pulling out of the electrons from the charge-storage layer lowers the threshold level (which may be, e.g., a data erasing state).

The most important parameter for the data reprogramming of the memory cell described above is a ratio C1/C2 of a capacitance C1 between the charge-storage layer 105 and the substrate 101 to a capacitance C2 between the control gate 108 and the charge-storage layer 105. With the substrate set at an electric potential of 0, when a voltage Vcg is applied to the control gate 108, a voltage Vfg of the charge-storage layer 105 is given such as Vfg=C2·Vcg/(C1+C2). Accordingly, a voltage applied to the tunnel insulating film 104 is determined by a coupling ratio K=C2/(C1+C2)=1/{1+(C1/C2)}.

A generation of a tunnel current requires applying an electric field as high as several tens of MV/cm to the tunnel insulating film. It is required for attaining this that the high voltage Vfg on the order of 10V be applied to between the charge-storage layer and the substrate. The charge-storage layer is coupled to the control gate by capacitance-coupling; hence a high voltage of approximately 20V is needed as the voltage Vcg=K·Vfg to be applied to the control gates. Even when the same voltage is applied to the control gates, if the coupling ratio K is different, the voltage applied to the tunnel insulating film becomes different, to attain different threshold levels for the memory cell. This causes an expansion of a threshold value distribution in the programming state of the memory cell. It is therefore of importance to uniformize the coupling ratio K.

FIG. 3 shows dimensions of the respective elements of the conventional memory cell structure. A capacitance ratio C2/C1 is obtained by using these dimensions in the following formula:

$$C2/C1=\{Wa+2(d+Tsti++Wing)\}Tox/Wa \cdot Tono Wing=(Wsti-SL)/2$$

The capacitance C2 is determined by a face-to-face area between the charge-storage layer 105 and the control gate 108. Hence, variation in the capacitance C2 is caused by variation in thickness of the charge-storage layer and variation in a length Wing (which is so-called a Wing length) of an overhang into the isolation region of the charge-storage layer 105.

Further, there is a high possibility in which the thickness of the charge-storage layer 105 is not uniform as shown in FIG. 3 when the device forming area and the isolation region have different heights. The non-uniformity of the thickness of the charge-storage layer leads to variation in an effective surface areal size of the charge-storage layer. This is also a factor for causing variation in the capacitance C2.

The wing length Wing is determined by an isolation width Wsti and a cut width (a so-called slit width) SL of the charge-storage layer. Cell miniaturization in order to increase the capacity of the EEPROM and decrease the cost thereof, often results in the dimensions of the isolation width Wsti and the slit width SL becoming the minimum width among those decided when the memory cells have been manufactured. In the memory cell described previously, the slit width SL of the charge-storage layer 105 is smaller than the isolation width Wsti and is therefore the minimum dimension. The isolation width in combination with the device forming area, however, determines a pitch of the bit lines, and it is therefore desired that the isolation width Wsti be set small to the greatest possible degree in order to shrink the memory cell array area.

A method utilizing the side-wall remaining technique has already been proposed by the present inventors (K. Shimizu et al. '97IEDM) for achieving a small slit width falling within the range of the small isolation width and smaller than this isolation width. According to this method, the masking material for slit processing is formed in pattern on the charge-storage layer, and thereafter an additional masking material is deposited with the side wall remaining, thereby obtaining a small slit width. FIGS. 4A to 4E show the memory cell manufacturing process described above.

As shown in FIG. 4A, gate material layers 105a are deposited on a silicon substrate 101 through a gate insulating film 104, and masking materials 201 are provided on the layers 105a, thus making a pattern formation so that the gate material layers 105a are left on the device forming area. Then, as illustrated in FIG. 4B, isolation trenches are formed by etching the substrate 101 by use of the masking materials 201, and the isolation insulating films 102 are embedded into these trenches. Subsequently, as shown in FIG. 4C, the gate material layers 105a are deposited again, and masking materials 202 for slit processing are formed in pattern on the isolation insulating films 102.

Further, as shown in FIG. 4D, masking materials 203 are deposited thin and left on only side walls of the masking materials 202 by an isotropic dry etching. A slit-processing window smaller than the minimum processing dimension is thereby formed. Then, gate material layers 105 bare etched by using the masking materials 202 and 203, where by the charge-storage layer 105 taking the stacked structure of the gate material layers 105a and 105b is isolated by the isolation insulating films 102 and thus formed in pattern. Thereafter, as shown in FIG. 4E, a control gate 108 is provided via the inter-gate insulating film 107. The control gate 108 is, as described above, subjected to the isolation processing in the bit-line direction together with the charge-storage layer 105.

According to the method described above, however, after executing the slit processing to isolate the charge-storage layer by etching the gate material layers 105b in the process in FIG. 4D, the surfaces of the isolation insulating films 102 are etched in the process of removing the masking materials 202 and 203 by etching, and, as shown in FIG. 4E, narrow trenches 204 are formed in slit separating portions of the charge-storage layer 105. The trenches 204 formed in the surfaces of the isolation insulating films 102 continuously extend in the bit-line direction the y-direction in FIG. 1) as well as being formed in the section in FIG. 4E wherein the control gate 108 is provided. This trench 204 is extremely narrow, and therefore, deposition of the materials of the inter-gate insulating film 107 and of the control gate 108 to fill these trenches 204, produces etching residues along the trenches 204 in the patterning process thereof. This might cause a gate short-circuit accident. Further, the thickness of the isolation insulating film 102 just under the control gate 108 decreases, and hence, a thin isolation insulating film 102 lowers an isolation function.

As discussed above, in the EEPROM including the memory cells based on the stacked structure of the charge-storage layer and the control gate, with the hyperfine structure of the device, there exists a problem in which a data reprogramming performance declines due to variation in capacitance-coupling that is caused by the ununiformity of the thickness of the charge-storage layer and by variation in descent width of the slit for separating the charge-storage layer. Another problem is that when executing the processing of the slit narrower than the isolation width on the isolation insulating film for separating the charge-storage layers, a layer reduction of the isolation insulating film occurs, and an gate-to-gate short-circuit accident is caused due to deterioration of the isolation performance and the gate residues as well.

Discussed next are well-known structures of several types of memory cells and their disadvantages.

FIGS. 5A and 5B show a first well-known example of memory cell having a STI (Shallow Trench Isolation) structure. FIG. 5A is a plan view, and FIG. 5B is a sectional view taken along the line A–A' in FIG. 5A.

As shown, isolation trenches 302 are formed in a p-type silicon substrate or p-well 301. Each trench 302 is filled with an isolation material, such as, silicon dioxide. Formed on the entire surface of an element region (channel region) 308 on the substrate that has been subjected to isolation is a thin tunnel-insulating film 4 through which a tunnel current will flow, and a charge-storage layer 5 thereon. Moreover, a control gate 307 is formed on the charge-storage layer 305 via a gate-to-gate insulating film 306. It is shown in FIG. 5B that bottom portions 305a of the charge-storage layer 305 protrude downwardly along the isolation trenches 2.

FIGS. 6A to 6D are sectional views each illustrating a step of manufacturing the STI-cell structure shown in FIGS. 5A and 5B.

As illustrated in FIG. 6A, a dummy insulating film 310 is formed on the semiconductor substrate 301, and a masking material 311, such as, photoresist, is deposited on the insulating film 310. The masking material 311, dummy insulating film 310 and substrate 301 in the isolation region are etched by photolithography so that their side walls are flush with each other to form the trenches 2.

The surface of the trench-side wall is oxidized by thermal oxidation with appropriate requirements. The thermal oxidation results in a "bird's beak" structure formed at each dummy insulating film 310, with the masking material 311 as a mask against the oxidation. The "bird's beak" structure is thicker than an oxide film formed at each trench side wall, thus resulting in a round edge at each trench.

An isolation insulating film is deposited on the entire surface of the semiconductor substrate to fill the trenches 320 with an isolation insulating film 3. The upper surface of the insulating film 303 is polished, or etched back by dry etching or polished by chemical-mechanical polishing (CMP), thus the upper surface of the masking material 311 being exposed (FIG. 6B).

The masking material 311 and the dummy insulating film 310 are peeled off by dry etching or wet etching with chemicals, and a tunnel insulating film 304 and a charge-storage layer 305 are deposited thereon (FIG. 6C).

The charge-storage layer 305 is patterned into slits by lithography on the isolation region, and the gate-to-gate insulating film 306 and the control gate 307 are deposited thereon with gate formation by patterning to finish fabrication of the cell structure (FIG. 6D).

Discussed next with a memory cell operation is the reason for the bottom portions 305a of the charge-storage layer 305 protruding downwardly along the isolation trenches 302.

Data programming to a memory cell having such a tunnel oxide film is performed by modulation of charges stored in the charge-storage layer 5 by charge transfer between the layer 305 and the substrate 301. At least either charge-injection or charge-discharging is performed with FN (Fowler-Nordheim) tunneling. In detail, a high electric filed at 10 MV/cm or more is applied to between the charge-storage layer 305 and the substrate 301 to discharge electrons from the former to the latter or from the latter to the former. The electron discharging will not change the charges stored in the charge-storage layer 305 unless there is no data reprogramming because it is in a complete floating state.

High-voltage application to the charge-storage layer 305 requires voltage application to the control gate 307 for capacitance-coupling therebetween. A high voltage to the control gate, however, forces several transistors that constitute a voltage regulator for generating such a high voltage, input/output switching circuitry, and so on, to have high withstand voltages, thus resulting in a large element region.

A voltage Vfg to be applied to the tunnel insulating film 304 is given by the following expression:

$$Vfg = C2/(C1+C2)Vcg$$

where C1 and C2 represent the capacitance between the charge-storage layer 305 and the semiconductor substrate 301 via the tunnel insulating film 304 and that between the charge-storage layer 305 and the control gate 307 via the gate-to-gate insulating film 306, respectively; and Vcg represents a control gate voltage.

As is apparent from the expression that a higher capacitance C2, that is, the capacitance between the charge-storage layer 305 and the control gate 307 via the gate-to-gate insulating film 306, is efficient to lower the voltage to be applied to the control gate 307. A high capacitance C2 can be attained with a large area for the control gate 307 and charge-storage layer 305 facing each other, which is achieved by forming the layer 305 as protruding from the element region to the isolation region as already discussed.

The second well-known memory cell structure described above, however, has two major drawbacks.

The first drawback lies in difficulty attaining a miniaturized width for isolation. Cutting the charge-storage layer 305 into slits on the isolation region requires microfabrication for the slits narrower than widths of the element region and isolation region. Lithography is generally used for slit formation. However, slit formation on the isolation region requires a pattern arrangement such that slit patterns will not overlap the isolation region located thereunder even though the slit patterns displace due to lithography. This results in a wide isolation width even slit patterns are formed as narrower than the isolation width. It is concluded that the well-known memory cell structure fabricated with slit formation using lithography for charge-storage layers has difficulty in miniaturization of isolation region.

The second drawback lies in difficulty attaining a miniaturized width for device areas. The well-known memory cell structure could have an exposed trench side wall during wet etching for peeling off the dummy isolation film. Such an exposed trench side wall produces a parasitic MOS capacitance between the side wall and the charge-storage layer via the tunnel isolation film as already discussed. The smaller the rounded trench side wall end, the worse the cut-off characteristics for the memory cell transistors due to generation of the kink characteristics in the sub-threshold range. Moreover, data-programming by FN-tunneling electron injection with a high voltage to the control gate generates gate electric field mostly on the parasitic MOS capacitance, thus causing dielectric breakdown to the tunnel isolation film.

A further rounded trench side wall can protect the tunnel isolation film from dielectric breakdown. A trench sidewall with excess oxidation for rounding, however, forms a bird's beak at the side wall as discussed above, thus producing an element region width extremely narrower compared when the trench is formed. This requires patterns wide enough for canceling width reduction due to oxidation for rounding of the trench side wall. Moreover, the larger the bird's beak, the more the variation in size thereof, thus causing difficulty in control of miniaturized device size.

As discussed above, the second well-known STI memory cell structure has drawbacks on miniaturization of the isolation width and element region width.

FIGS. 7A and 7B illustrate the second well-known STI structure introduced in the Japanese Un-examined Patent Publication 10-017948 as one example of a STI structure for solving the problems discussed above. FIG. 7A is a plan view and FIG. 7B is a sectional view taken along the line B–B'.

As shown, isolation trenches 2 are formed in a p-type silicon substrate or p-well 301. Each trench 302 is filled with an isolation insulating material 303, such as, silicon dioxide. Formed on the entire surface of the channel region on the substrate that has been subjected to isolation is a thin tunnel-insulating film 304 through which a tunnel current will flow. Formed on the tunnel-insulating film 304 is a charge-storage layer 312, the side wall thereof meeting the end of the isolation region. The isolation insulating film 303 touches the charge-storage layer 312. A portion of the side wall of the charge-storage layer 312 is exposed and faces a control gate 314 via a gate-to-gate insulating film 313 to increase capacity between the charge-storage layer 312 and the control gate 314. The charge-storage layer 312 and the control gate 314 are formed by self-alignment in the vertical direction so that their side walls are flush with each other. An n-type diffused layer 309 is formed between the gates.

FIGS. 8A to 8D are sectional views each illustrating a step of manufacturing the STI-cell structure shown in FIGS. 7A and 7B.

A conductive material 312 that will become a charge-storage layer and a masking material 315 are deposited over the semiconductor substrate 301 via the tunnel-insulating film 304. The masking material 315, the conductive material 312, the tunnel-insulating film 304 and the semiconductor substrate 301 in the isolation region are etched so that their side walls are flush with each other to form trenches 302 (FIG. 8A).

The surface of the trench-side wall is oxidized by thermal oxidation with appropriate requirements before deposition of the isolation insulating film 303. The upper surface of the insulating film 303 is polished, or etched back by dry etching or polished by chemical-mechanical polishing (CMP), thus the upper surface of the masking material 315 being exposed (FIG. 8B).

The isolation insulating film 303 is further etched back to expose a side-wall portion of the charge-storage layer 312, followed by peeling-off the masking material 315 (FIG. 8C).

The gate-to-gate insulating film 313 and the control gate 314 are deposited thereon with gate formation by pattering to finish fabrication of the cell structure (FIG. 8D).

The third well-known STI-cell structure requires no dummy isolation film like the first well-known STI-cell structure. This is because, in the second well-known STI-cell structure, the tunnel-insulating film and the charge-storage layer are deposited before formation of the trenches with the isolation insulating film filled therein. The second well-known structure has no exposed trench-side wall, thus suitable for miniaturization of element region width.

Moreover, this STI-cell structure requires no formation of the charge-isolation layer into slits on the isolation region because it is completely isolated thereon, thus achieving miniaturization of isolation region width in this respect.

On the other hand, the second well-known STI-cell structure has difficulty in miniaturization of isolation region width with respect to a high aspect of trenches filled with the isolation insulating film. As described, the first well-known STI-cell structure has a large area of the charge-storage layer that faces the control gate with a portion of the charge-storage layer protruding along the isolation insulating film. Contrary to this, the second well-known structure attains a large area of the charge-storage layer with its side-wall portion facing the control gate, thus requiring a charge-storage layer thick enough for facing the control gate.

Suppose that an aspect ratio is 2 for an isolation insulating film with no voids when buried into a 0.3 µm-deep trench with a 0.15 µm-thick charge-storage layer. Under the requirements, a 0.275 µm-wide isolation width is offered for burying an insulating film via 0.1 µm-thick masking material; whereas the first well-known STI-cell structure offers 0.2 µm-wide isolation width at a low aspect because of not so narrow charge-storage layer when embedding an insulating film. The second well-known STI-cell structure has restriction of isolation width due to embedding an isolation insulating film, not to slit formation to the charge-storage layer.

As discussed above, a non-volatile semiconductor memory device with the well-known STI-cell structure has difficulty in miniaturization of element region width and isolation width, thus causing restriction of miniaturization of memory cells.

SUMMARY OF THE INVENTION

It is a primary object of the present invention, which was devised under such circumstances, to provide a non-volatile semiconductor memory device with a small variation in capacitance-coupling to a stacked layer gates which would occur during cell miniaturization and with an excellent data reprogramming performance, and also a manufacturing method thereof.

It is a second object of the present invention to provide a non-volatile semiconductor memory device with miniaturized memory cells without any layer reduction for an isolation insulating film for charge-storage layer isolation, thus neither a gate-to-gate short-circuit defect nor deterioration in an isolation performance being induced.

It is a third object of the present invention to provide a non-volatile semiconductor memory device having memory cells of a narrow isolation width with a low aspect of embedding an isolation insulating film and a method of fabricating the non-volatile semiconductor memory device.

The present invention, according to the first aspect, provides a non-volatile semiconductor memory device including: a semiconductor substrate; an isolation insulating film, provided on the semiconductor substrate, for defining a device forming region; and a memory cell array constructed of memory cells arranged in array and each including a first gate provided via a first gate insulating film on the semiconductor substrate, and a second agate provided via a second gate insulating film on the first gate, wherein the first gate of the memory cell is provided in pattern so that a part of the first gate is overlapped on the isolation insulating film from the device forming region, and a protective insulating film is disposed on the isolation insulating film interposed between the device forming regions adjacently to the first gate.

A non-volatile semiconductor memory device according to the present invention is provided with a protective insulating film disposed on the isolation insulating film interposed between device forming regions. Therefore, the present invention achieves prevention of both the layer reduction for the isolation insulating film and the decline in isolation performance. Moreover, uniformity in capacitance-coupling is enhanced by substantially flattening the surface of the first gate.

Further, when the protective insulating film is provided continuously on the isolation insulating film in such a direction as to be orthogonal to a longitudinal direction of the second gate, a trench is not formed in the isolation insulating film astride between adjacent gates, whereby an occurrence of a gate-to-gate short-circuit accident can be prevented.

The present invention, according to the second aspect provides a non-volatile semiconductor memory device a non-volatile semiconductor memory device including: a semiconductor substrate; an isolation insulating film, provided on the semiconductor substrate, for defining a plurality of device forming regions continuous in one direction at a predetermined interval; and a memory cell array constructed of a plurality of memory cells arranged in array on the semiconductor substrate and each including a charge-storage layer provided via a first gate insulating film on the device forming region, and a control gate disposed in such a direction as to traverse the isolation insulating film via a second gate insulating film on the charge-storage layer and extending continuously astride of the plurality of memory cells, wherein the charge-storage layer of the memory cell is provided in pattern so that apart of the charge-storage layer is superposed on the isolation insulating film from above the device forming region, and a protective insulating film covered with the second gate insulating film and a control gate is disposed on the isolation insulating film interposed between the device forming regions adjacently to the charge-storage layer.

The followings are structures, materials etc used for the respective elements of the memory device of the present invention.

(1) The isolation insulating film is provided by a method of forming a trench in the semiconductor substrate and embedding the isolation insulating film into this trench. An entire interior of the isolation insulating film is not necessarily consistent as an insulating film. For example, a semiconductor such as polycrystalline silicon is embedded into the trench formed in the semiconductor substrate through the insulating film, and the surface thereof may be covered with the insulating film. Further, the isolation insulating film may also be provided by a selective oxidizing method (LOCOS method).

(2) The device forming region is an active layer region defined by the isolation insulating film.

(3) The first gate insulating film is a tunnel insulating film. The tunnel insulating film is preferably a silicon oxide layer formed by thermal oxidation, or a silicon nitride layer formed by thermal nitrification and a deposition method, or a stacked layer thereof (e.g., an ONO layer), further, the tunnel insulating film may be a silicon nitride oxide layer.

(4) The first gate is the charge-storage layer, i.e., a floating gate. The first gate is polycrystalline silicon or amorphous silicon exhibiting a high electric conductivity by doping an impurity.

(5) The second gate insulating film is a silicon oxide layer, a silicon nitride layer, or a silicon oxide nitride layer, or a stacked layer of the silicon oxide layer and the silicon nitride layer (e.g., the ONO layer).

(6) The second gate is a control gate. The second gate is the polycrystalline silicon or amorphous silicon exhibiting the high electric conductivity by doping the impurity, and, in addition, silicide of a refractory metal such as tungsten (W), a stacked layer of silicide and silicon, salicide obtained by depositing titanium (Ti) on silicon and making them chemically reactive, and a metal such as aluminum.

(7) It is required that the protective insulating film disposed on the isolation insulating film be an insulating film different in type from the isolation insulating film, in other words, an insulating film having an etching characteristic different from that of the isolation insulating film. For example, when the isolation insulating film is the silicon oxide layer, the silicon nitride layer etc is used as the protective insulating film.

The present invention, according to the third aspect, provides a method of manufacturing a non-volatile semiconductor memory device, including the steps of: depositing a first gate material layer via a first gate insulating film on a semiconductor substrate; forming a masking material for isolation in pattern on the first gate material layer; forming an isolation trench so as to define device forming regions continuous in a first direction at a predetermined interval in a second direction orthogonal to the first direction by etching the first gate material layer and the semiconductor substrate by use of the masking material; embedding an isolation insulating film into the isolation trench so as to be substantially flush with the masking material; forming in pattern, on the isolation insulating film, a stacked layer of a protective insulating film for protecting the isolation insulating film and a gate embedding-oriented insulating film so as to be continuous in the first direction; removing the masking material by etching with the stacked layer serving as a mask; forming a charge-storage layer taking a stacked layer structure of the first gate material layer and a second gate material layer by depositing the second gate material layer and polishing the surface thereof, the charge-storage layer being isolated on the isolation insulating film by the stacked layer; depositing, after removing the gate isolation insulating film on the isolation insulating film, a third gate material layer via the second gate insulating film on the charge-storage layer and the protective insulating film; and forming in pattern the control gate continuous in the second direction and the charge-storage layer self-aligned with the control gate and isolated in the first direction by sequentially etching the third gate material layer, the second gate insulating film and the charge-storage layer.

The present invention, according to the fourth aspect, provides a non-volatile semiconductor memory device including a cell array of a plurality of memory cells connected to each other, each memory cell having: a plurality of trenches aligned on a semiconductor substrate in one direction; an isolation region in which an isolation insulating film is buried in each trench; a plurality of semiconductor regions electrically isolated by the isolation region; a charge-storage layer formed on each semiconductor region via a first gate insulating film; and a control gate formed on the charge-storage layer via a second gate insulating film, wherein the charge-storage layer is a stacked layer of two or more conductive layers, a side end portion of the lowest conductive layer of the conductive layers being located to meet a wall of each trench, the highest conductive layer having the same width as or being wider than the lowest conductive layer, and the upper surface of the isolation insulating film being flush with the upper surface of the highest conductive layer of the charge-storage layer.

This non-volatile semiconductor memory device has the charge-storage layer of a stacked layer of two or more conductive layers. The side end portion of the lowest conductive layer of the conductive layers is located to meet a wall of each trench, thus no parasitic transistors formed at the upper end portion of each trench for miniaturization of element region width; hence achieving a miniaturized device.

The highest conductive layer of the charge-storage layer may be wider than the lowest conductive layer for increase in capacitance between the charge-storage layer and the control gate.

The upper surface of the isolation insulating film may be flush with the upper surface of the highest conductive layer of the charge-storage layer.

This achieves stable formation of an insulating film between the control gate and charge-storage layer. Moreover, this flattened arrangement restricts variation in area in which the control gate and the charge-storage layer face each other for achieving constant cell characteristics.

The present invention, according to the fifth aspect, provides a non-volatile semiconductor memory device including a cell array of a plurality of memory cells connected to each other, each memory cell having: a plurality of trenches aligned on a semiconductor substrate in one direction; an isolation region in which an isolation insulating film is buried in each trench; a plurality of semiconductor regions electrically isolated by the isolation region; a charge-storage layer formed on each semiconductor regions via a first gate insulating film; and a control gate formed on the charge-storage layer via a second gate insulating film, wherein the charge-storage layer is a stacked layer of two or more conductive layers, a side end portion of the lowest conductive layer of the conductive layers being located to meet a side wall of each trench, the highest conductive layer having the same width as or being wider than the lowest conductive layer, and the upper surface of the isolation insulating film being located between the lower surface and the upper surface of the highest conductive layer of the charge-storage layer.

This non-volatile semiconductor memory device has the charge-storage layer of a stacked layer of two or more conductive layers. The side end portion of the lowest conductive layer of the conductive layers being located to meet a wall of each trench, thus no parasitic transistors formed at the upper end portion of each trench for miniaturization of element region width; hence achieving a miniaturized device. The highest conductive layer of the charge-storage layer maybe wider than the lowest conductive layer for increase incapacitance between the charge-storage layer and the control gate. The upper surface of the isolation insulating film is located between the lower surface and the upper surface of the highest conductive layer of the charge-storage layer, thus also forming capacitance at a side-wall portion of the highest layer of the charge-storage layer.

The highest conductive layer of the charge-storage layer may be formed in self-alignment to the isolation region.

This self-alignment structure offers miniaturization of element region width; hence achieving a miniaturized device.

The highest and the lowest conductive layers of the charge-storage layer may be electrically connected to each other in a short-circuited state or at the same potential.

This connection offers a constant potential in the charge-storage layer, thus achieving restriction of variation in characteristics among the memory cells.

The highest conductive layer of the charge-storage layer may have the same thickness as or is thicker than the lowest conductive layer.

The thin lowest layer offers a low aspect ratio for burying the isolation insulating films. The thick highest layer attains an enough thickness, even the lowest layer is thin, for achieving a preferable charge storage capability.

It is preferable that the second insulating film is formed on the upper surface of the charge-storage layer, the upper surface of the isolation insulating film and a side face of the highest layer of the charge-storage layer, the side face being extending from the upper surface of the isolation insulating film to the upper surface of the highest layer, the control gate being formed on the second insulating film.

This structure provides capacitance also to a side-wall portion of the highest layer of the charge-storage layer, thus increasing overall capacity for decreasing a voltage to be applied to the control gate for data-reprogramming.

The step formed between the isolation insulating film buried in each trench and the highest surface of the charge-storage layer may be almost constant in the cell array.

This structure offers a stable cell characteristics.

The non-volatile semiconductor memory device may also have switching-selection transistors in the cell array, having the same stacked-gate structure as the memory cells.

This arrangement formation of the selection transistors in the memory cell-manufacturing process.

The non-volatile semiconductor memory device may also have transistors each having a first gate electrode formed on the semiconductor substrate via a third insulating film and a second gate electrode formed as touching the first gate electrode.

This structure offers a stacked-gate structure, like the memory cells, to the peripheral transistors that drive the memory cells, thus achieving decrease in steps formed in gate formation.

It is preferable that the third gate insulating film of each transistor includes at least two types of films of different thickness, the third gate insulating film for a transistor of the transistors, for high-withstand voltage application, being thicker than the first insulating film, and the third gate insulating film for another transistor of the transistors, for low-voltage application, having the same thickness or being thinner than the first insulating film.

This structure offers low-voltage-driven high speed transistors for sense-amplifiers and high-voltage-driven high-withstand voltage transistors for voltage boosters and input/output switches, thus achieving a non-volatile semiconductor memory device that is operated by a single power supply.

It is preferable that the first gate electrode is formed of two or more conductive layers electrically connected to each other like the charge-storage layer, a side end portion of the lowest conductive layer of the first gate electrode, that touches the isolation region, meeting a side wall of each trench.

This arrangement offers a stacked structure to the gate electrode for the transistors the same as for the charge-storage layer and the control gate for the memory cells, thus achieving simplified manufacturing process.

It is preferable that a plurality of conductive layers that constitute the first gate electrode are made of the same material as the plurality of conductive layers that constitute the charge-storage layer of each memory cell, the second gate electrode being made of the same material as the control gate of each memory cell.

This arrangement also offers a stacked structure to the gate electrode for the transistors the same as for the charge-storage layer and the control gate for the memory cells, thus achieving simplified manufacturing process.

It is preferable that the step between the upper surface of the isolation insulating film buried in each trench and the highest surface of the charge storage layer is smaller than the step between the upper surface of the isolation insulating film buried in each trench in a circuit including the transistors and the highest surface of the first gate electrode in the cell array.

This structure offers a decreased thickness to the isolation insulating film in the process of peeling off the second gate insulating film in the transistor, enabling etching-back to entire surface of the isolation insulating film for exposing the side wall of the chare-storage layer, thus achieving simplified manufacturing process.

The present invention, according to the sixth aspect, provides a non-volatile semiconductor memory device including a cell array of a plurality of memory cells connected to each other, each memory cell having: a plurality of isolation region in which an isolation insulating film is buried in each of trenches aligned in one direction on a semiconductor substrate; a plurality of semiconductor regions electrically isolated by the isolation regions; charge-storage layers each formed on respective semiconductor region via a first gate insulating film, each charge-storage layer having two or more conductive layers stacked each other; and a control gate formed on the charge-storage layer via a second gate insulating film, wherein the semiconductor memory device has a relationship $Y>X1>X2$ or $Y>X1=X2$ where $X1$ denotes a distance between side end portions of the isolation regions adjacent to each other, $Y$ denotes a distance between side end portions of the lowest layers of the charge-storage layers adjacent to each other and $X2$ denotes a distance between side end portions of the highest layers of the adjacent charge-storage layers.

This structure offers the highest layer of the charge-storage layer wider than the lowest layer, thus achieving increase in capacitance between the charge-storage layer and the control gate.

The present invention, according to the seventh aspect, provides a method of manufacturing a non-volatile semiconductor memory device, including the steps of: forming a first gate insulating film on a semiconductor substrate; forming a first conductive layer as the lowest layer of a charge-storage layer on the first gate insulating film; forming a masking material on the first conductive layer; forming a trench by etching the masking material, the first conductive layer, the first gate insulating film and the semiconductor substrate so that side end portions thereof meet each other; oxidizing at least a side wall of the trench and a side-wall surface of the first conductive layer; depositing an isolation insulating film to fill the trench with the isolation insulating film; flattening the isolation insulating film to expose the upper surface of the masking material; peeling off the masking material to expose the upper surface of the fist conductive layer; depositing a second conductive layer on the semiconductor substrate, the second conductive layer being the highest layer of the charge-storage layer; flattening the second conductive layer so that the upper surface of the second conductive layer is flush with the upper surface of the isolation insulating film; forming a second gate insulating film on the second conductive layer and the isolation insulating film; depositing a control gate material on the second gate insulating film; and processing the deposited control gate material into a predetermined shape.

The present invention, according to the eighth aspect, provides a method of manufacturing a non-volatile semiconductor memory device, including the steps of: forming a first gate insulating film on a semiconductor substrate; forming a first conductive layer as the lowest layer of a charge-storage layer on the first gate insulating film; forming a masking material on the first conductive layer; forming a trench by etching the masking material, the first conductive layer, the first gate insulating film and the semiconductor substrate so that side end portions thereof meet each other; oxidizing at least a side wall of the trench and a side-wall surface of the first conductive layer; depositing an isolation insulating film to fill the trench with the isolation insulating film; flattening the isolation insulating film to expose the upper surface of the masking material; peeling off the masking material to expose the upper surface of the first conductive layer; depositing a second conductive layer on the semiconductor substrate, the second conductive layer being the highest layer of the charge-storage layer; flattening the second conductive layer so that the upper surface of the second conductive layer is flush with the upper surface of the isolation insulating film; selectively etching the isolation insulating film so that the upper surface of the isolation insulating film is located between the lower and the upper surfaces of the second conductive layer; forming a second gate insulating film on a side wall of the second conductive layer that has been exposed by the etching, the upper surface of the second conductive layer and the upper surface of the isolation insulating film; depositing a control gate material on the second gate insulating film; and processing the deposited control gate material into a predetermined shape.

The present invention, according to the ninth aspect, provides a method of manufacturing a non-volatile semiconductor memory device, including the steps of: forming a first gate insulating film on a semiconductor substrate; forming a first conductive layer as the lowest layer of a charge-storage layer on the first gate insulating film; forming a masking material on the first conductive layer; forming a trench by etching the masking material, the first conductive layer, the gate insulating film and the semiconductor substrate so that side end portions thereof meet each other; oxidizing at least a side wall of the trench and a side-wall surface of the first conductive layer; depositing an isolation insulating film to fill the trench with the isolation insulating film; flattening the isolation insulating film to expose the upper surface of the masking material; peeling off the masking material to form a concave portion through which the first conductive layer is exposed; isotropic-etching the concave portion to increase a width thereof in a lateral direction; depositing a second conductive layer as the highest layer of the charge-storage layer on the semiconductor substrate, on the isolation insulating film and in the concave portion; flattening the second conductive layer so that the upper surface of the second conductive layer is flush with the upper surface of the isolation insulating film; selectively etching the isolation insulating film so that the upper surface of the isolation insulating film is located between the lower and the upper surfaces of the second conductive layer; forming a second gate insulating film on a side wall of the second conductive layer that has been exposed by the etching, the upper surface of the second conductive layer and the upper surface of the isolation insulating film; depositing a control gate material on the second gate insulating film; and processing the deposited control gate material into a predetermined shape.

The method offers stable manufacturing of the non-volatile semiconductor memory device.

The present invention, according to the tenth aspect, provides a method of manufacturing a non-volatile semiconductor memory device, including the steps of: forming a first gate insulating film on a semiconductor substrate; forming a first conductive layer as the lowest layer of a charge-storage layer on the first gate insulating film; forming a masking material on the first conductive layer; forming a trench by etching the masking material, the first conductive layer, the first gate insulating film and the semiconductor substrate so that side end portions thereof meet each other; oxidizing at least a side wall of the trench and a side-wall surface of the first conductive layer; depositing an isolation insulating film to fill the trench with the isolation insulating film; flattening the isolation insulating film to expose the upper surface of the masking material; peeling off the masking material to expose the upper surface of the first conductive layer; depositing a second conductive layer on the semiconductor substrate, the second conductive layer being the highest layer of the charge-storage layer; flattening the second conductive layer so that the upper surface of the second conductive layer is flush with the upper surface of the isolation insulating film; selectively etching the isolation insulating film so that the upper surface of the isolation insulating film is located between the lower and the upper surfaces of the second conductive layer; forming a second gate insulating film on a side wall of the second conductive layer that has been exposed by the etching, the upper surface of the second conductive layer and the upper surface of the isolation insulating film; depositing a control gate material on the second gate insulating film; and processing the deposited control gate material into a predetermined shape.

The present invention, according to the eleventh aspect, provides a method of manufacturing a non-volatile semiconductor memory device, including the steps of: forming a first gate insulating film on a semiconductor substrate; forming a first conductive layer as the lowest layer of a charge-storage layer on the first gate insulating film; forming a masking material on the first conductive layer; forming a trench by etching the masking material, the first conductive layer, the gate insulating film and the semiconductor substrate so that side end portions thereof meet each other; oxidizing at least a side wall of the trench and a side-wall surface of the first conductive layer; depositing an isolation insulating film to fill the trench with the isolation insulating film; flattening the isolation insulating film to expose the upper surface of the masking material; peeling off the masking material to form a concave portion through which the first conductive layer is exposed; isotropic-etching the concave portion to increase a width thereof in a lateral direction; depositing a second conductive layer as the highest layer of the charge-storage layer on the semiconductor substrate, on the isolation insulating film and in the concave portion; flattening the second conductive layer so that the upper surface of the second conductive layer is flush with the upper surface of the isolation insulating film; selectively etching the isolation insulating film so that the upper surface of the isolation insulating film is located between the lower and the upper surfaces of the second conductive layer; forming a second gate insulating film on a side wall of the second conductive layer that has been exposed by the etching, the upper surface of the second conductive layer and the upper surface of the isolation insulating film; depositing a control gate material on the second gate insulating film; and processing the deposited control gate material into a predetermined shape.

DESCRIPTION OF THE PREFERRED EMBODIMENTS

Preferred embodiments according to the present invention will be disclosed with reference to the accompanying drawings.

Figure 9A:
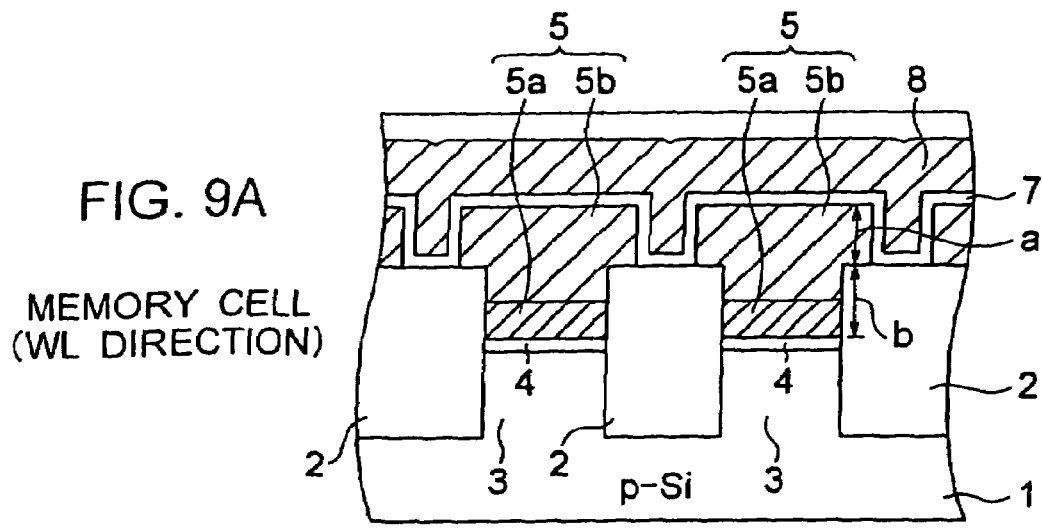
FIGS. 9A to 9C are sectional views showing the structures of memory cell and transistor in peripheral circuitry for EEPROM in the first embodiment.
Figure 9B:
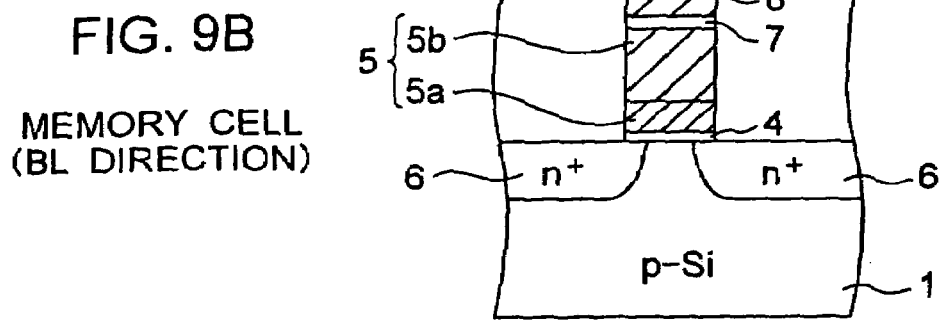
Figure 9C:
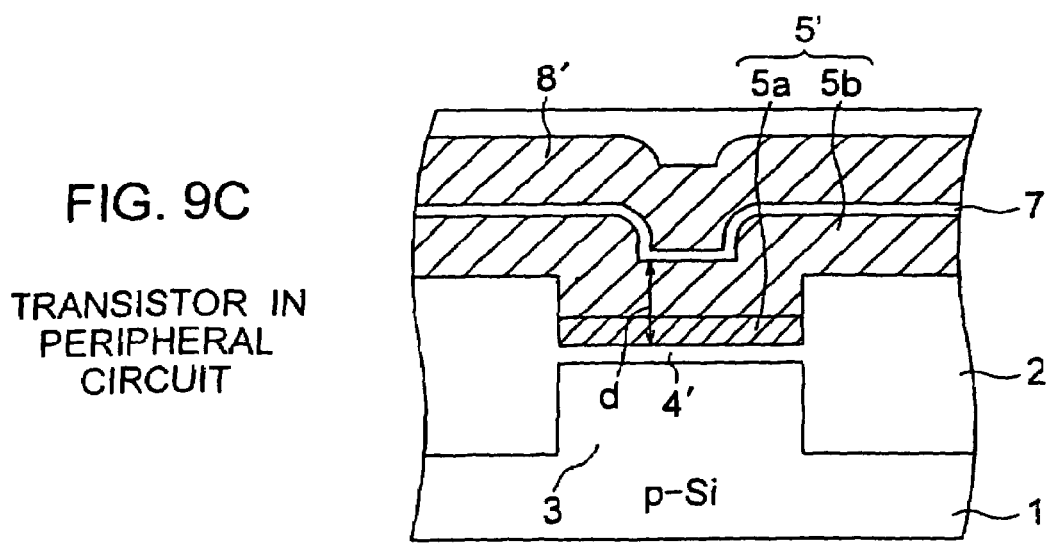

FIGS. 9A to 9C are sectional views each showing a structure of essential components of an EEPROM as the first preferred embodiment according to the present invention. FIG. 9A is a sectional view of a memory cell in the direction of a word line WL (or channel width of the memory cell). FIG. 9B is a sectional view of the memory cell in the direction of a bit line BL (or channel length of the memory cell). FIG. 9C is a sectional view of a transistor in the peripheral circuitry.

A p-type silicon substrate 1 is provided with a device forming region 3 having an isolation insulating film 2 buried therein by a STI technique, for example. Formed in a memory cell array region is a first gate (floating gate) 5 as a charge-storage layer of a stacked layer of a first gate material film 5a and a second gate material film 5b via tunnel-insulating film 4 as a first gate insulating film in the device forming region. Formed on the floating gate 5 is a second gate (control gate) 8 of a third gate material film via a second gate insulating film 7. The control gate 8 is continuously patterned in the plane of FIG. 9A to form a word line. Formed under the control gate 8 are n$^+$ diffused layers 6 to be a source and a drain by self-alignment.

The second gate material film 5b as one component of the floating gate 5 of the memory cell is patterned so that it is overlapped, partially, with the isolation insulating film 2 from the concave device forming region 3 located between the isolation insulating films 2. The entire surface of the floating gate 5 is, however, almost flat, as illustrated in FIG. 9A. Such a flat surface for the control gate 5 is achieved by having a narrow width for the device forming region 3 located between the isolation insulating films 2 and selecting a deposited film thickness of the floating gate 5 in the same degree or more compared with the width of the device forming region 3, with no active flattening process.

Transistors in the peripheral circuitry generally have a large size compared to the memory cells. As shown in FIG. 9C, a step between the isolation insulating film 2 and the device forming region 3 is reflected on the upper surface of a first gate 5' made of the same material as that for the memory cell array and the floating gate 5. The thickness of the floating gate 5 over the device forming region 3 in the memory cell is (a+b), that is, an addition of the step "b" between the isolation insulating film 2 and the device forming region 3 to the film thickness "a" on the isolation insulating film 2. The film thickness "d" is given to the first gate 5' over the device forming region 3 for the transistors in the peripheral circuitry. The film thickness (a+b) for the floating gate 5 over the device forming region in the memory cell is thicker than the film thickness "d" for the first gate 5' over the device forming region 3 for the transistors in the peripheral circuitry. The first gate 5' and a second gate 8' (made of the same material as that for the control gate 8 of the memory cell) are short-circuited at an appropriate position to become agate electrode for the transistors in the peripheral circuitry.

Figure 1:
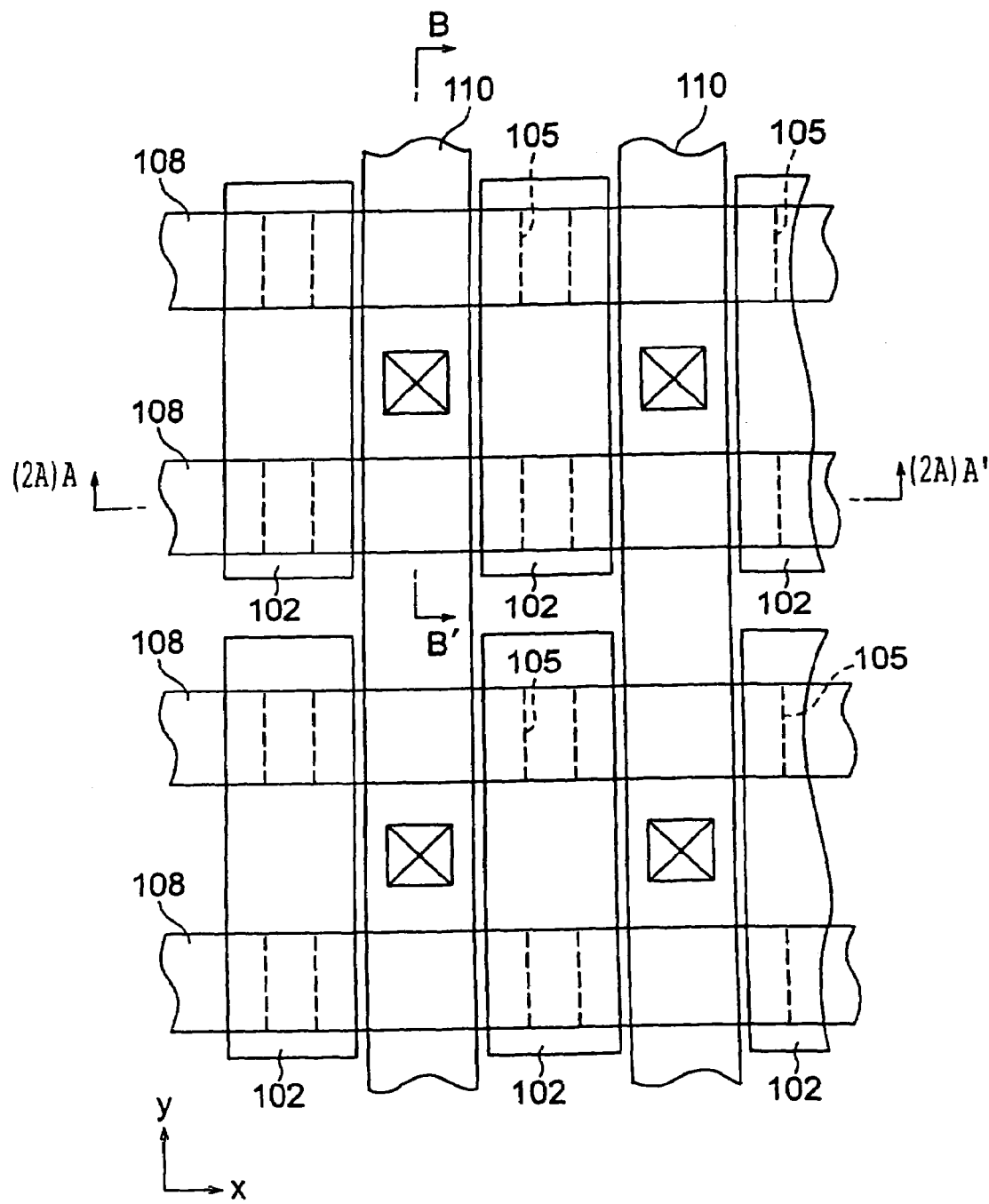
FIG. 1 is a plan view of a memory cell array of a conventional EEPROM.
Figure 10:
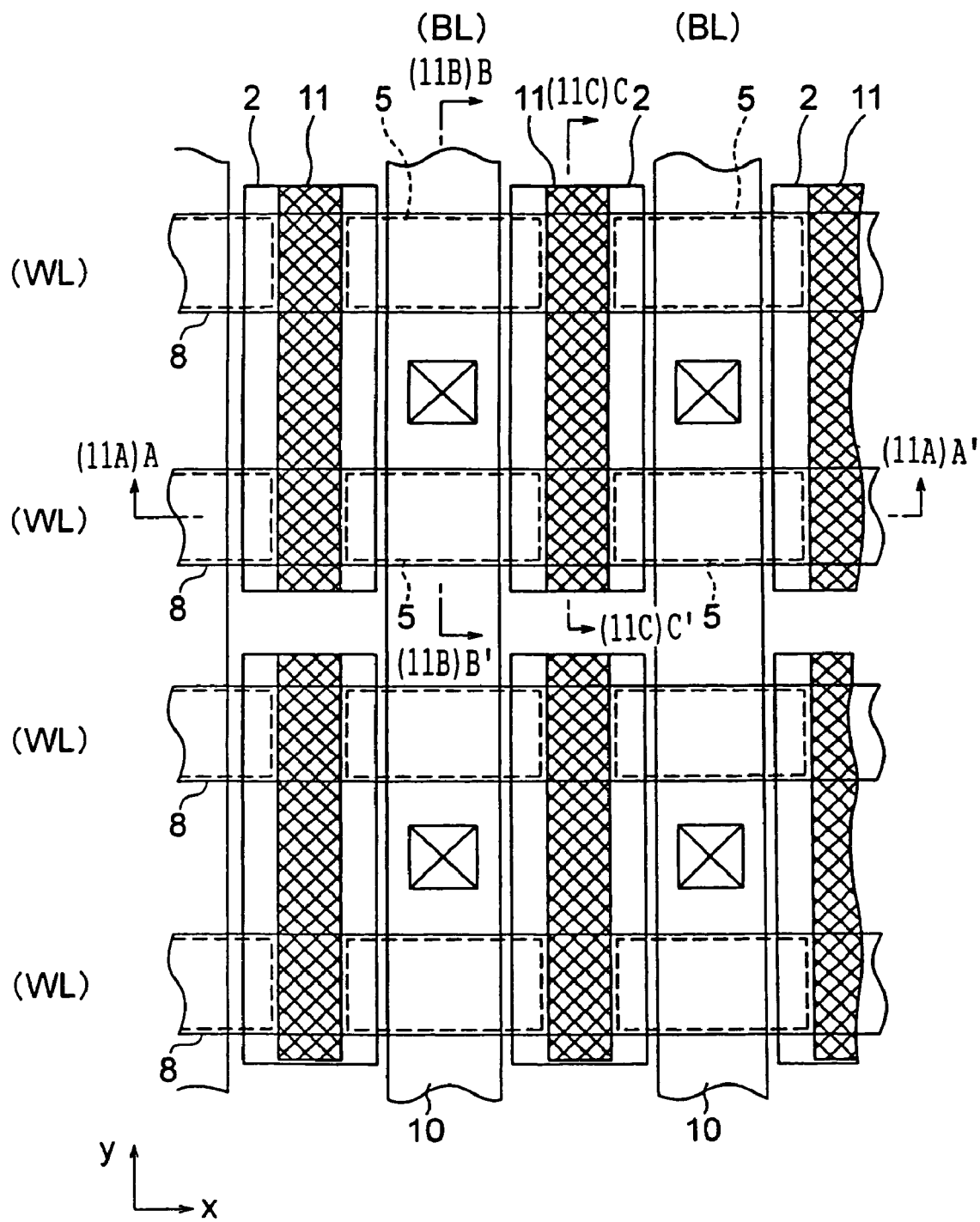
FIG. 10 is a plan view showing a memory cell array of the EEPROM in the second embodiment of the present invention.
Figure 11A:
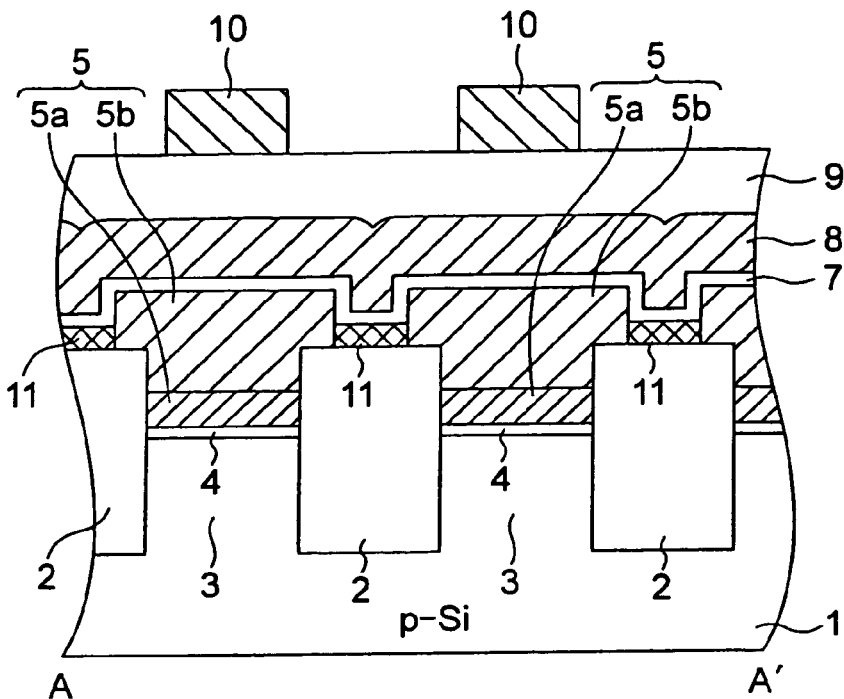
FIGS. 11A to 11C are sectional views taken along the lines A–A', B–B' and line C–C', respectively, in FIG. 10.
Figure 11B:
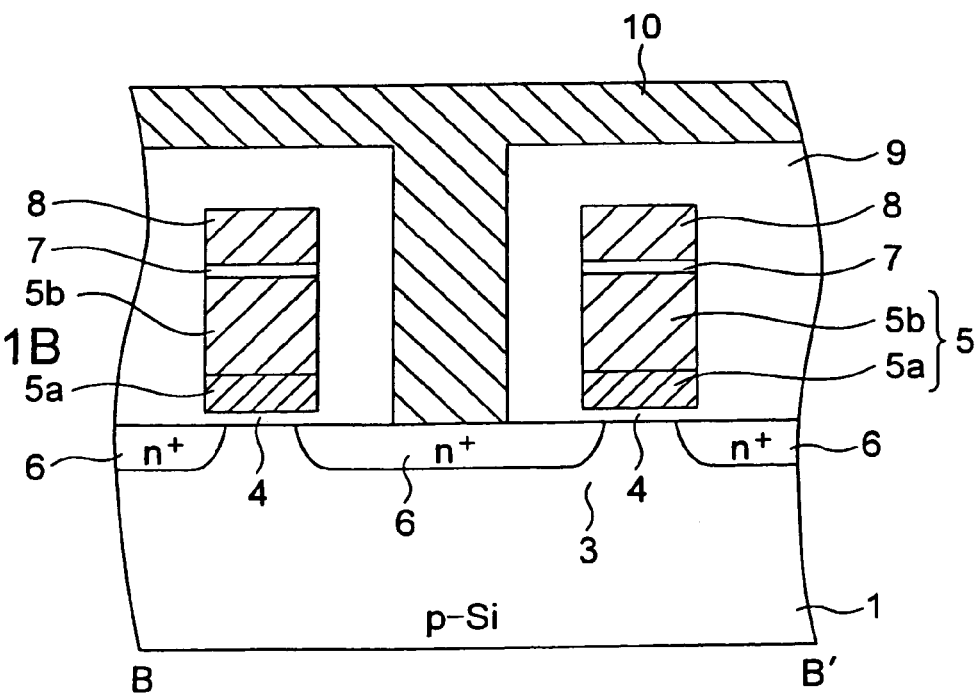
Figure 11C:
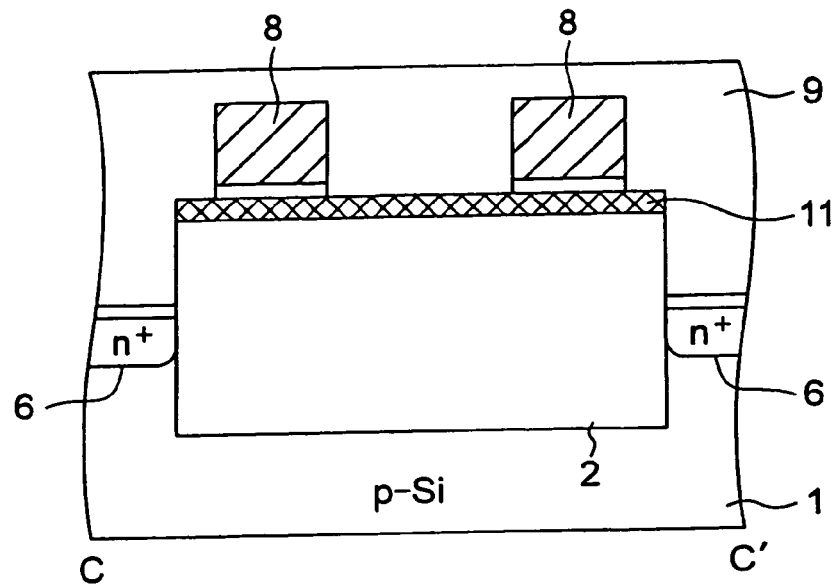

FIG. 10 is a plan view showing a memory array cell area of a NOR type EEPROM according to the second embodiment of the present invention. FIGS. 11A, 11B and 11C are sectional views taken along the lines A–A', B–B' and C–C', respectively, in FIG. 1. More specifically, FIG. 11A is the sectional view showing the memory cell in a word-line (WL) direction (in a trench width direction of the memory cell). FIG. 11B is the sectional view showing the same memory cell in a bit-line (BL) direction (in a trench length direction of the memory cell). Further, FIG. 11C shows a sectional structure at an isolation layer.

On a p-type silicon substrate 1, a plurality of thin and long device forming regions 3 are sectioned in the y-direction (the bit-line direction) orthogonal to the x-direction by isolation insulating film 2 provided at an equal interval in the y-direction (the word-line direction).

In the memory cell array area, first gates (floating gates) 5 serving as charge-storage layer and each constructed of a stacked layer of a first gate material layer 5a and a second gate material layer 5b are provided on a device forming region 3 via tunnel insulating films 4 defined as first gate insulating films. The second gate material layer 5b functioning as the floating gate of the memory cell is so provided in pattern as to superposed partially on the isolation insulating film 2 from the device forming region 3 interposed between the isolation insulating films and therefore including recessed portions. As shown in FIG. 1A, however, an upper surface of the floating gate 5 is substantially flat over its entire area. Flattening of the surface of the floating gate 5 may be attained by selecting thickness of a deposited layer of the floating gate 5 of which a width is substantially the same or larger than a narrow width of the device forming region 3 interposed between the isolation insulating films 2, without executing a positive flattening process.

Second gates (control gates) 8 composed of third gate material layers are provided through second gate insulating films 7 on the floating gates 5. The floating gate 5 is formed independently per memory cell, and the control gate 8 is formed continuously in the x-direction, thereby obtaining a word line WL. Provided in self-alignment with the control gate 8 are n+ type diffused layers 6 serving as a source and drain of the memory cell.

The control gate 8 and the floating gate 5 are provided so that side ends thereof in the y-direction are self-aligned. Ions are implanted with this stacked gate serving as a mask, thereby forming the n+ type diffused layers 6 serving as the source and drain of the memory cell.

The surface formed with the memory cell is covered with an inter-layer insulating film 9, and bit lines (BL) 10 are arranged continuously in the y-direction.

Figure 2A:
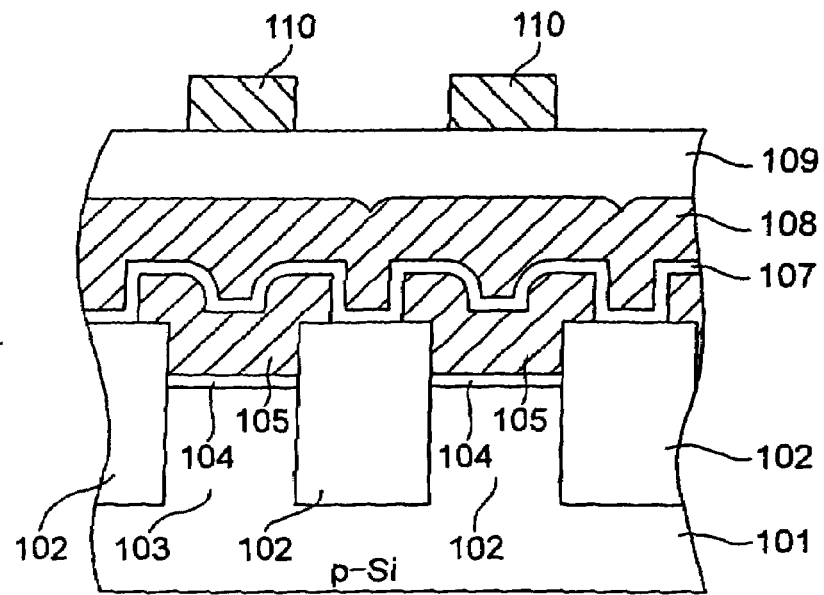
FIGS. 2A and 2B are sectional views taken along the lines A–A' and B–B' in FIG. 1.
Figure 2B:
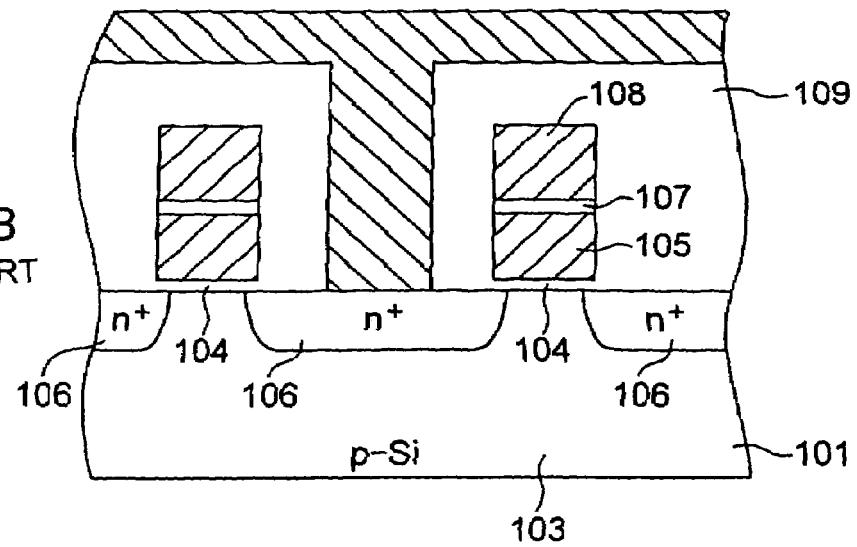
Figure 3:
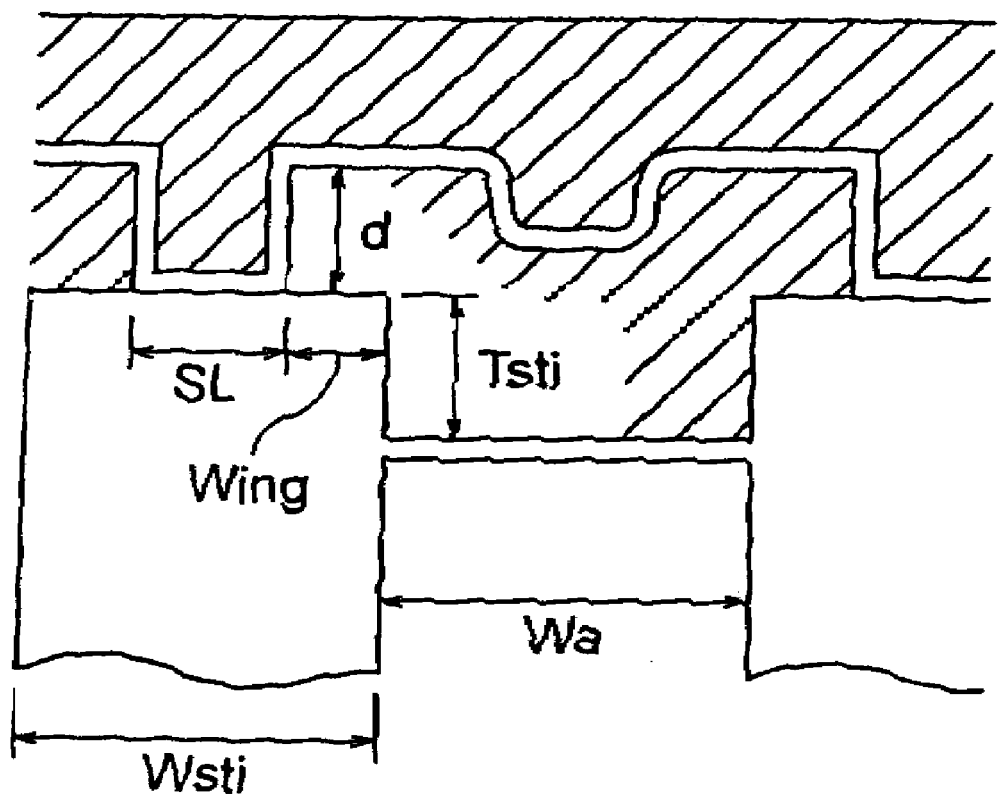
FIG. 3 is a view showing dimensions of respective elements in the conventional memory cell structure.
Figure 4A:
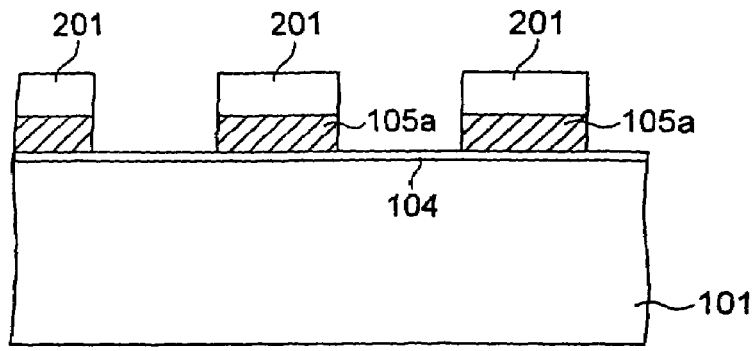
FIGS. 4A to 4E are sectional views illustrating steps of manufacturing a well-known memory cell.
Figure 4B:
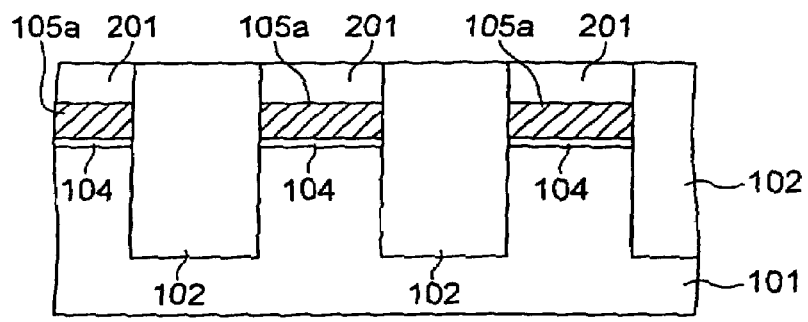
Figure 4C:
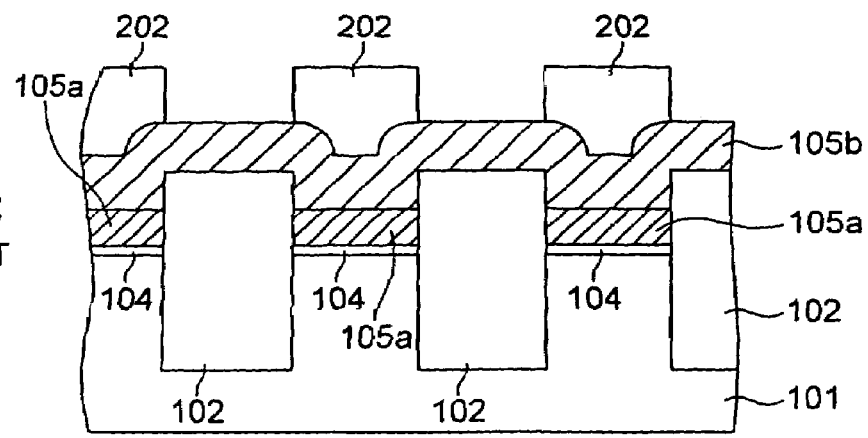
Figure 4D:
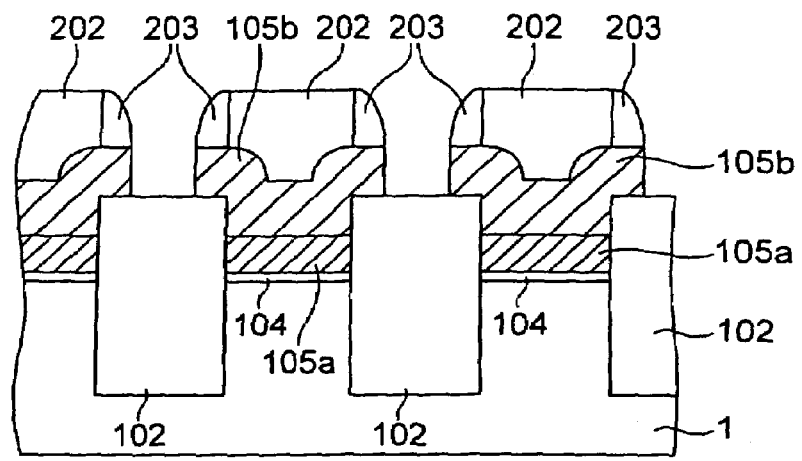
Figure 4E:
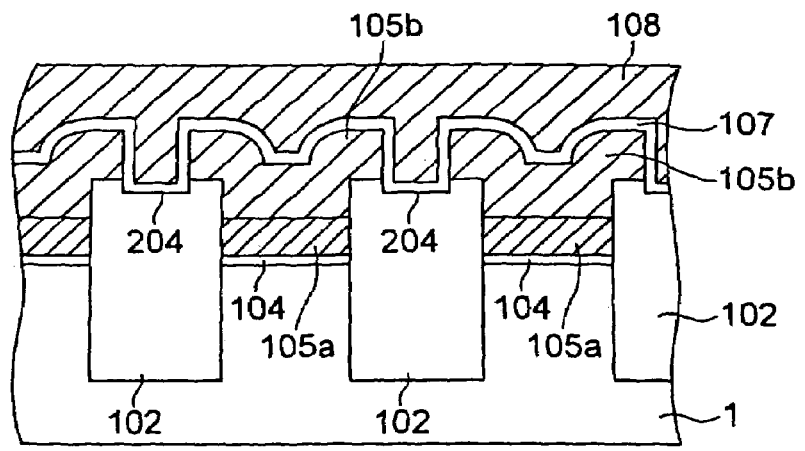
Figure 5A:
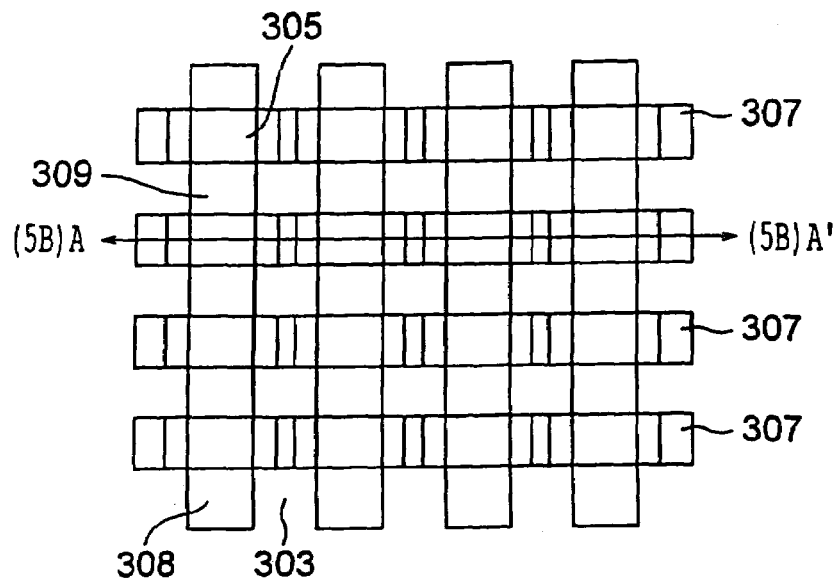
FIGS. 5A and 5B are a plan view and a sectional view, respectively, illustrating a second well-known non-volatile semiconductor memory device.
Figure 5B:
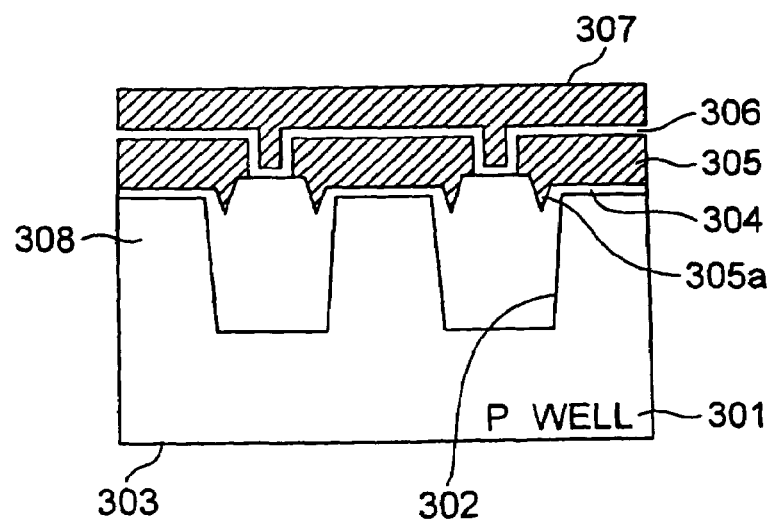
Figure 6A:
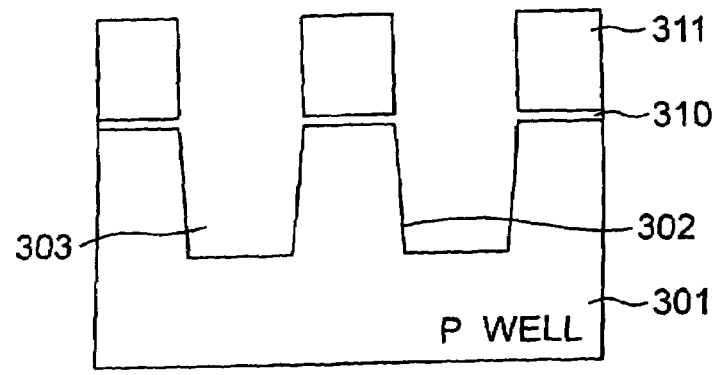
FIGS. 6A to 6D are sectional views each illustrating a step of manufacturing the structure shown in FIGS. 5A and 5B.
Figure 6B:
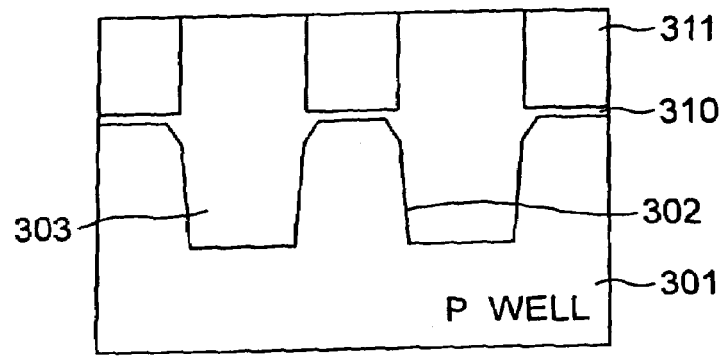
Figure 6C:
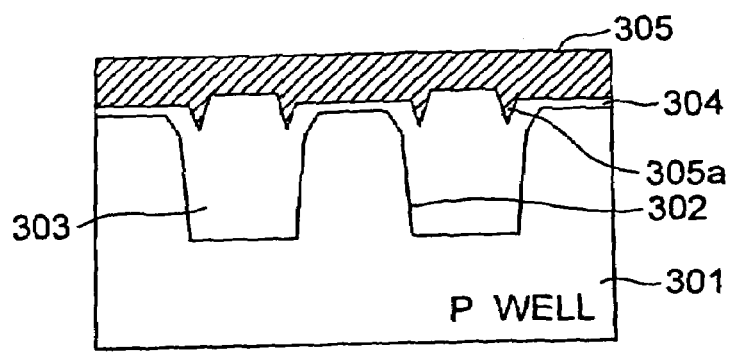
Figure 6D:
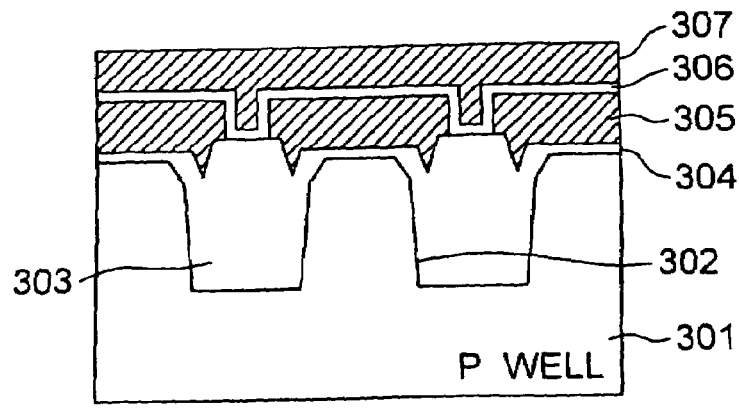
Figure 7A:
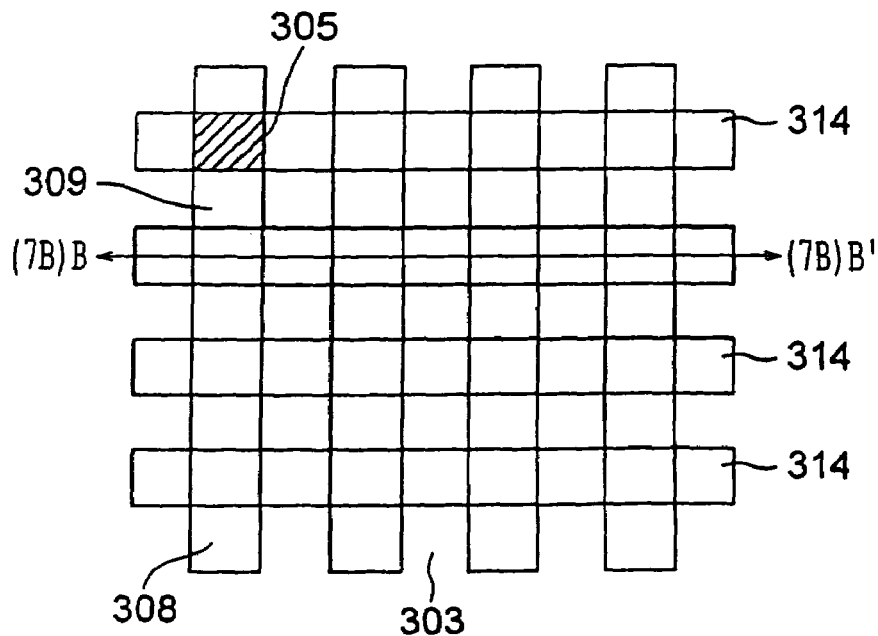
FIGS. 7A and 7B are a plan view and a sectional view, respectively, illustrating a third well-known non-volatile semiconductor memory device.
Figure 7B:
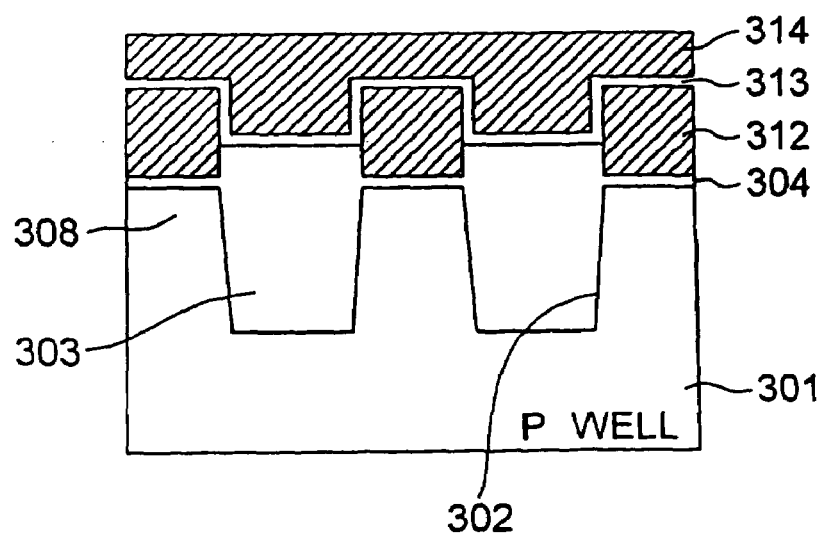
Figure 8A:
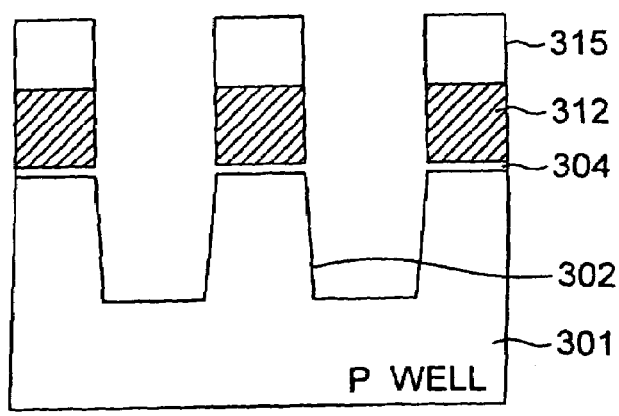
FIGS. 8A to 8D are sectional views each illustrating a step of manufacturing the structure shown in FIGS. 7A and 7B.
Figure 8B:
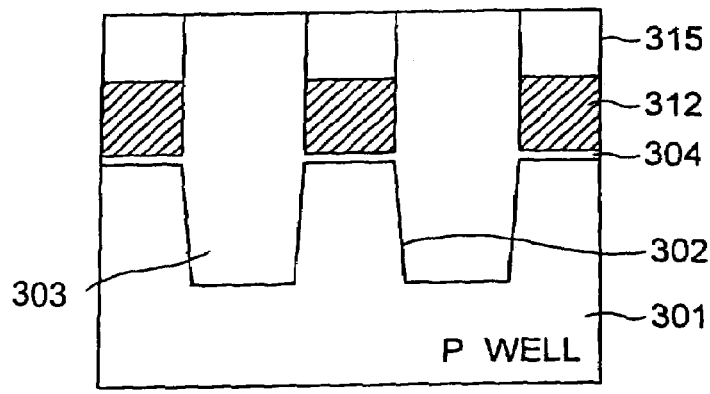
Figure 8C:
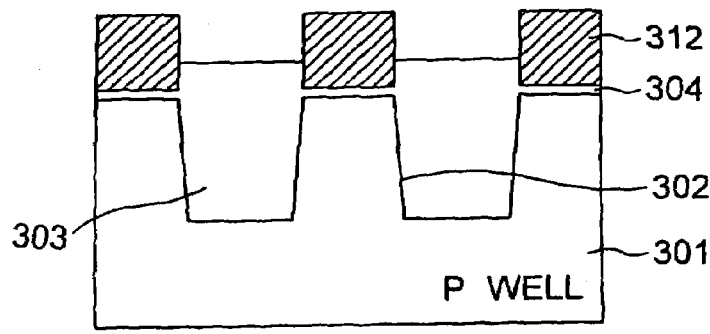
Figure 8D:
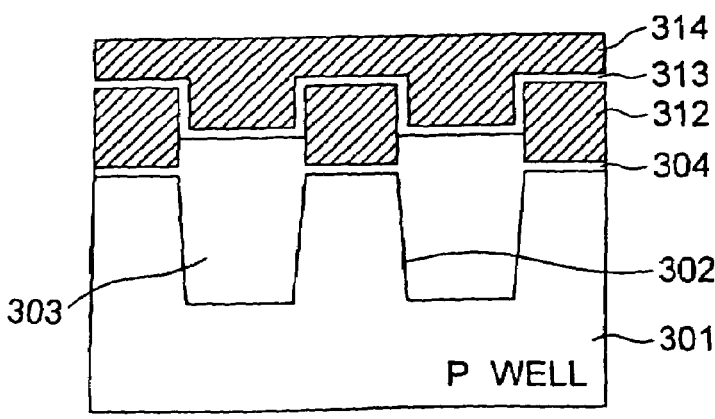

The floating gate 5 is provided partially in superposition on the isolation insulating film 2 from the device forming region 3, and is, as shown in the sectional view in FIG. 11A, cut in slit on the isolation insulating film 2 in the x-direction, thus being isolated for every individual memory cell. Then, a protective insulating film 11 for preventing the layer reduction of the isolation insulating film 2 in a state of being self-aligned with the side ends of the floating gates 5, is disposed between the side ends of the floating gates adjacent and facing to each other in the x-direction on the isolation insulating film 2. In fact, as will be explained later on, the second gate material layer 5b of the floating gate 5 is embedded by Damascene method in a way of being aligned with the protective insulation layer 11, and cut by the protective insulating film 11 in the x-direction. The protective insulating film 11 is, as shown in FIG. 2, disposed continuously in the y-direction on the isolation insulating film 2 and further extends to an area with neither the floating gate 5 nor the control gate 8.

It is required that the protective insulating film 11 be different in type from the isolation insulating film 2. For example, when the isolation insulating film 2 is composed mainly of a silicon oxide layer, the protective insulating film 11 involves the use of an insulating film composed chiefly of a silicon nitride layer. Further, a thickness of the protective insulating film 11 is set smaller than a thickness (more specifically, a thickness of the second gate material layer 5b) of the floating gate 5.

An upper surface of the floating gate of the memory cell has, as explained above, a narrow device forming region width, and is substantially flat when a deposited layer thickness of the gate material layer is equal to or larger than a given thickness. Then, when the surface of the floating gate 5 is flat as described above, there decreases variation in capacitance-coupling between the floating gate 5 and the control gate 8, and characteristics become uniform between a plurality of memory cells. It is therefore feasible to actualize the EEPROM excellent in terms of its data reprogramming performance and, to be specific, with a small distribution of the threshold level in a data programming state and in an erasing state.

Figure 16A:
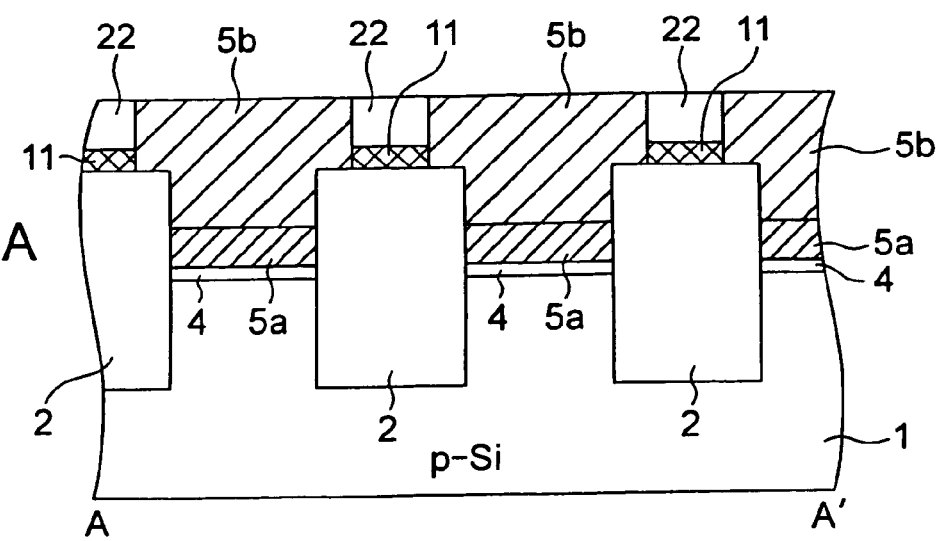
FIGS. 16A to 16C are sectional views taken along the lines A–A', B–B' and C–C', respectively, illustrating the steps of forming the second gate material layer for forming the memory cell array in the second embodiment.
Figure 16B:
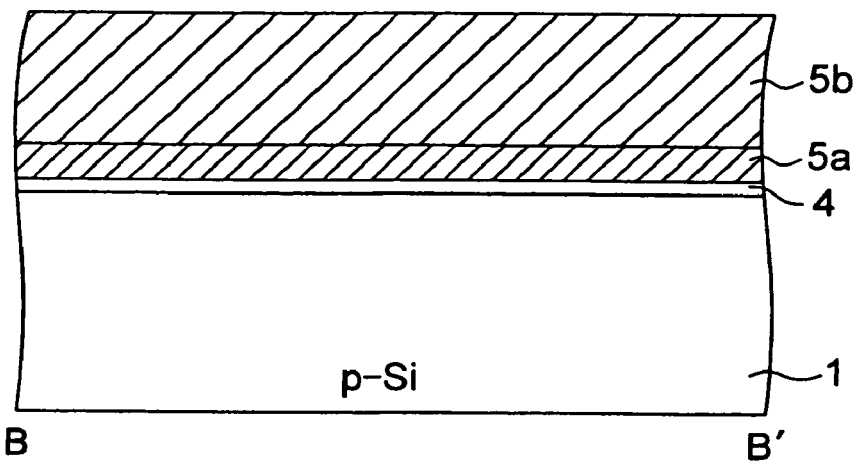
Figure 16C:
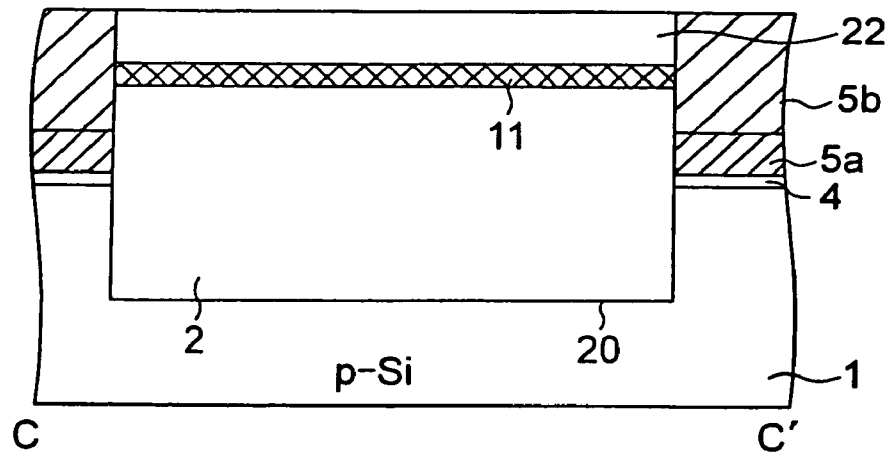

Next, a process of manufacturing the EEPROM cell array in the second embodiment will be explained with reference to sectional views in FIGS. 12A to 12C and to FIGS. 16A to 16C, each showing the process, corresponding to FIGS. 11A to 11C.

Figure 12A:
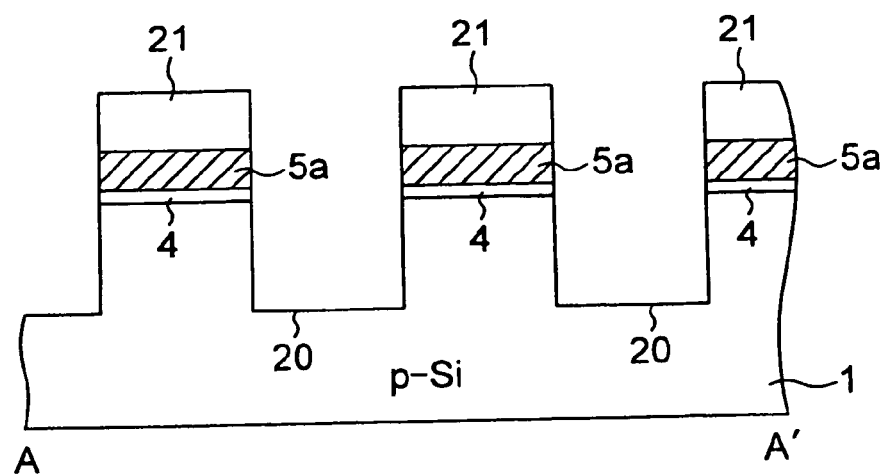
FIGS. 12A to 12C are sectional views taken along the lines A–A', B–B' and C–C', respectively, illustrating the steps of forming the isolation trench for forming the memory cell array in the second embodiment.
Figure 12B:
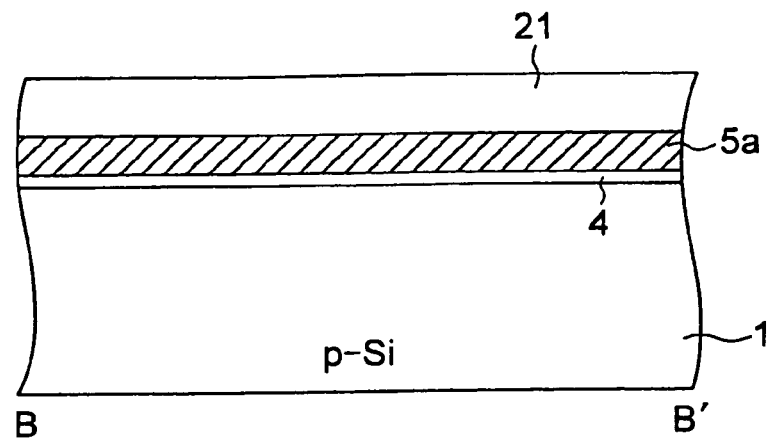
Figure 12C:
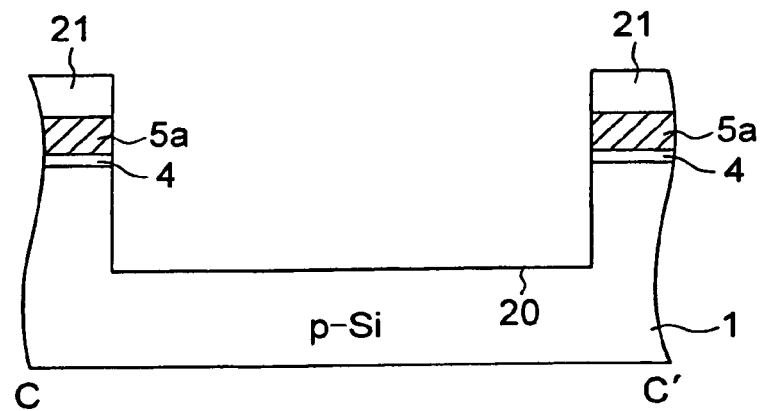

As shown in FIGS. 12A to 12C, tunnel insulating films 4 are formed by thermal oxidation etc on a p-type silicon substrate 1, the first gate material layers 5a are thereafter deposited, and masking materials 21 are provided in pattern on the gate material layers 5a. The first gate material layers 5a are, e. g., a polycrystalline silicon layer. The masking material 21 is, e.g., a silicon nitride layer formed in pattern to cover the device forming region. The first gate material layers 5a and the substrate 1 are etched by RIE with the masking material 21 to form a trench 20 in the isolation region.

Figure 13A:
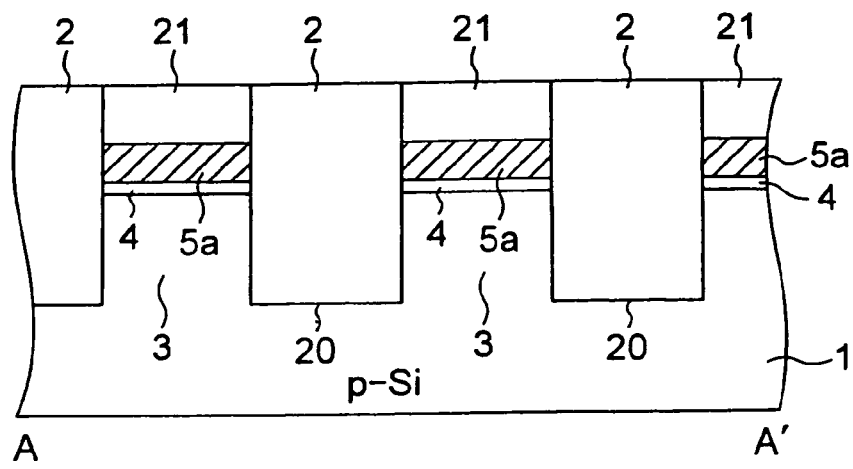
FIGS. 13A to 13C are sectional views taken along the lines A–A', B–B' and C–C', respectively, illustrating the steps of embedding the isolation insulating film for forming the memory cell array in the second embodiment.
Figure 13B:
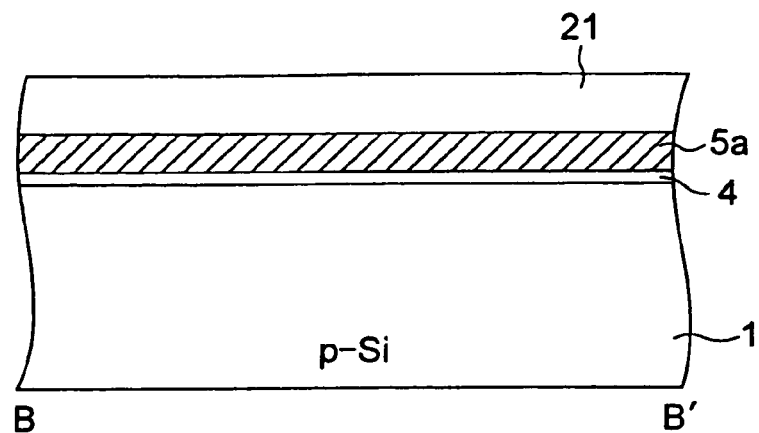
Figure 13C:
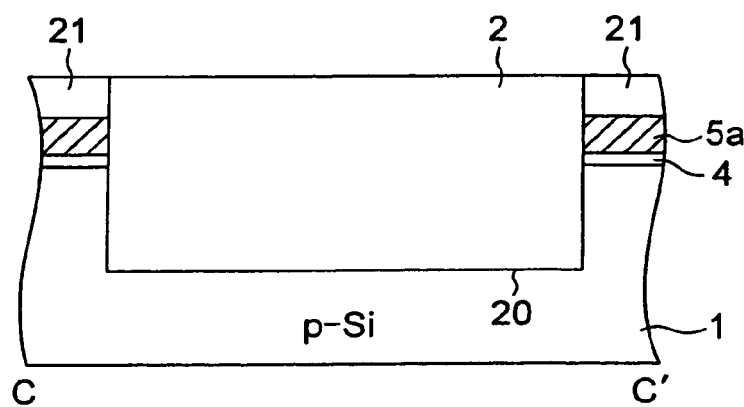

Then, as shown in FIGS. 13A to 13C, the isolation insulating film 2 composed of the silicon oxide layer is embedded into the trench 20 formed in the substrate 1 so that the surface thereof is flattened. This surface flattening may involve, e.g., depositing the silicon oxide layer thicker than a depth of the trench and, corresponding thereto, executing a CMP process in which the masking material 21 composed of the silicon nitride layer serves as a stopper.

Figure 14A:
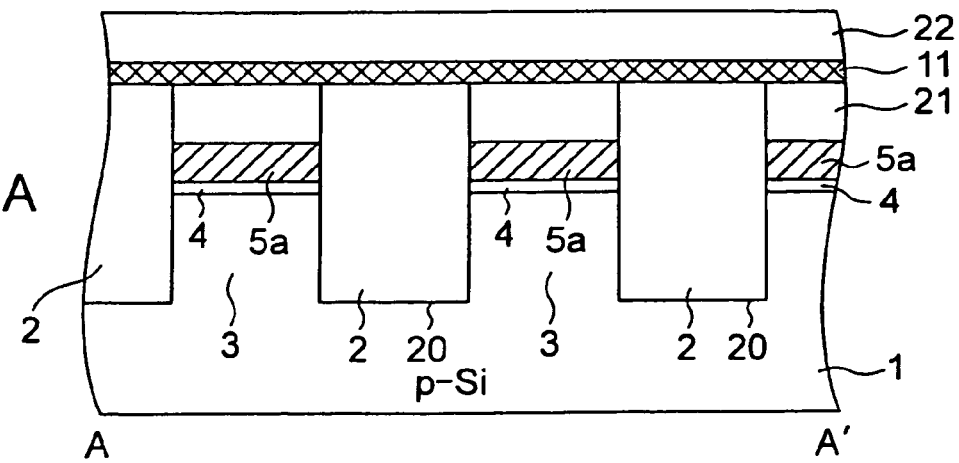
FIGS. 14A to 14C are sectional views taken along the lines A–A', B–B' and C–C', respectively, illustrating the steps of forming the protective insulating film for forming the memory cell array in the second embodiment.
Figure 14B:
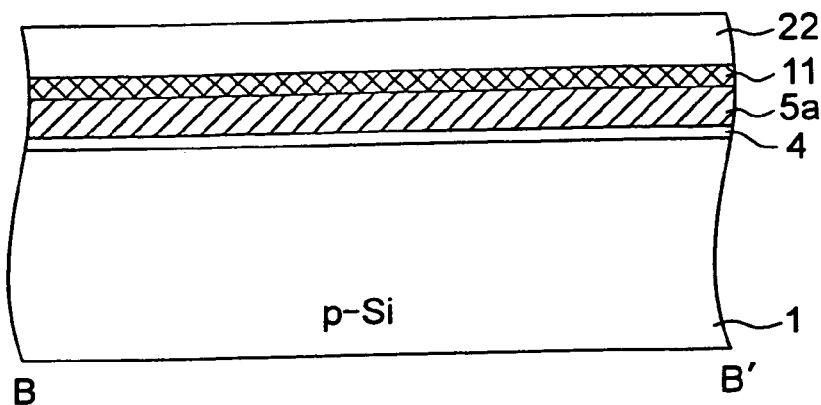
Figure 14C:
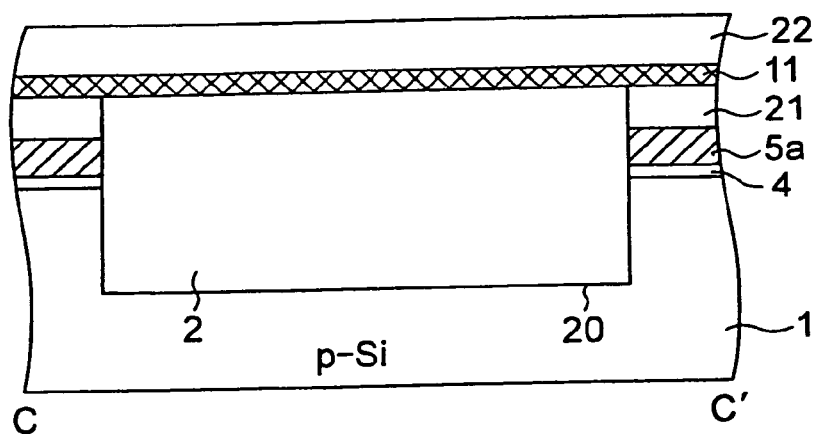

Next, as shown in FIGS. 14A to 14C, the protective insulating film 11 for protecting the isolation insulating film 2 is deposited on the substrate that has been processed for isolation and flattened, and further a gate embedding-oriented insulating film 22 for embedding and thus forming the floating gate by the Damascene method. To be specific, the protective insulating film 11 is the silicon nitride layer, and the gate embedding-oriented insulating film 22 is a TEOS oxide layer, thereafter, as shown in FIGS. 14A to 14C, the gate embedding-oriented insulating film 22 is formed as a mask pattern continuous in the y-direction in FIG. 10 on the isolation insulating film 2 by lithography and etching. Then, with this gate embedding-oriented insulating film 22 serving as a mask, the protective insulating film 11 is etched, and further the masking material 21 existing above the device forming region 3 is removed by etching.

Thereafter, a polycrystalline silicon layer as the second gate material layer 5b is deposited thick over the entire surface and flattened by the CMP process in which the gate embedding-oriented insulating film 22 is used as a stopper. With this processing, as illustrated in FIGS. 14A to 14C, the second gate material layer 5b is embedded in a state of being isolated by the gate embedding-oriented insulating film 22 on the isolation insulating film 2 in the x-direction. Thereafter, the gate embedding-oriented insulating film 22 is removed by wet etching using hydrofluoric acid etc. At this time, the protective insulating film 11 composed of the silicon nitride layer is not etched and is left on the isolation insulating film 2. Namely, a stacked layer of the first gate material layer 5a and the second gate material layer 5b takes a state of being isolated on the isolation insulating film between the adjacent memory cells with the isolation insulating film 2 being sandwiched in therebetween and in a state where the isolation insulating film 2 in that isolated region is covered with-the protective insulating film 11.

Figure 17A:
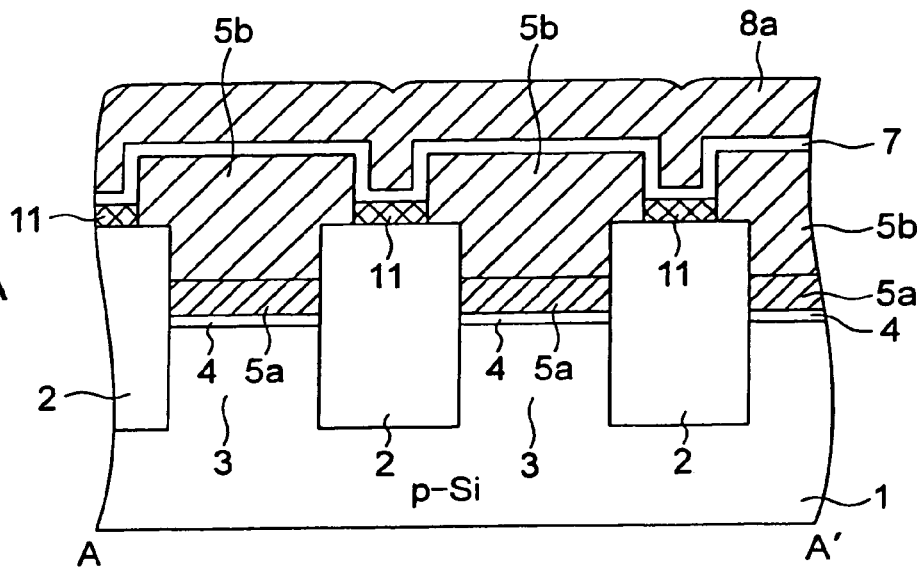
FIGS. 17A to 17C are sectional views taken along the lines A–A', B–B' and C–C', respectively, illustrating the steps of forming the third gate material layer for forming the memory cell array in the second embodiment.
Figure 17B:
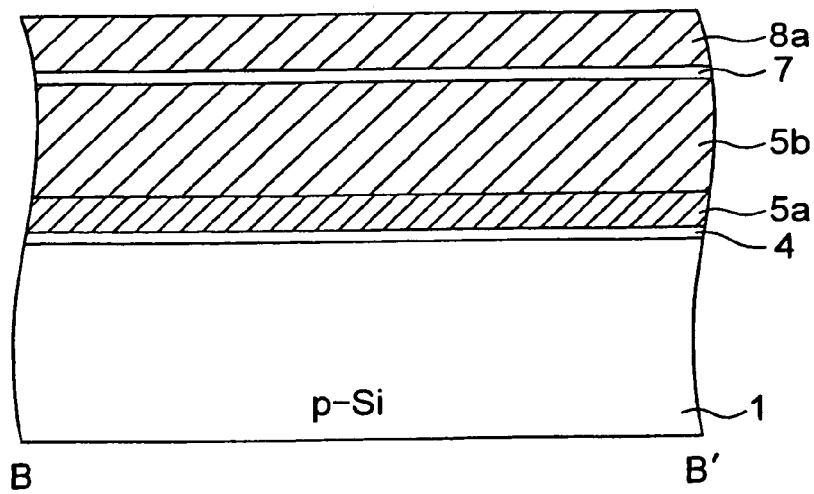
Figure 17C:
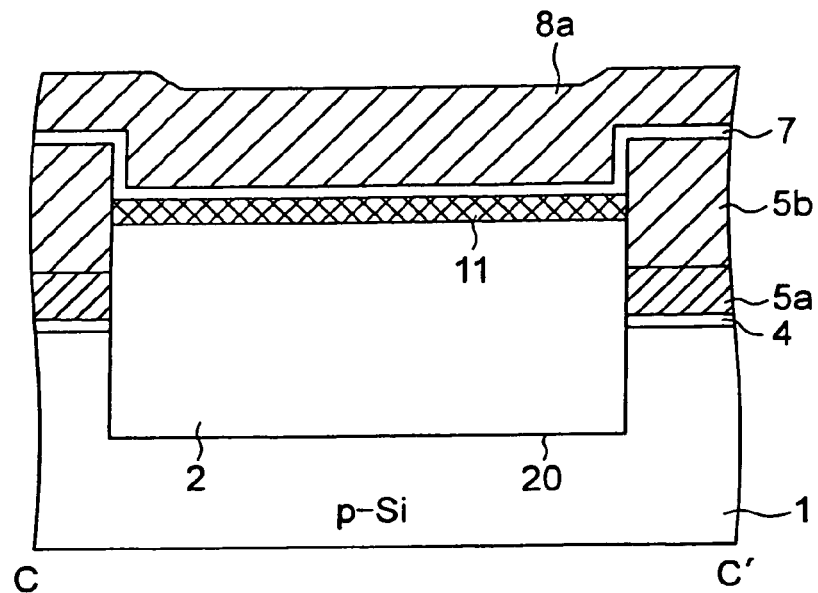
Figure 18A:
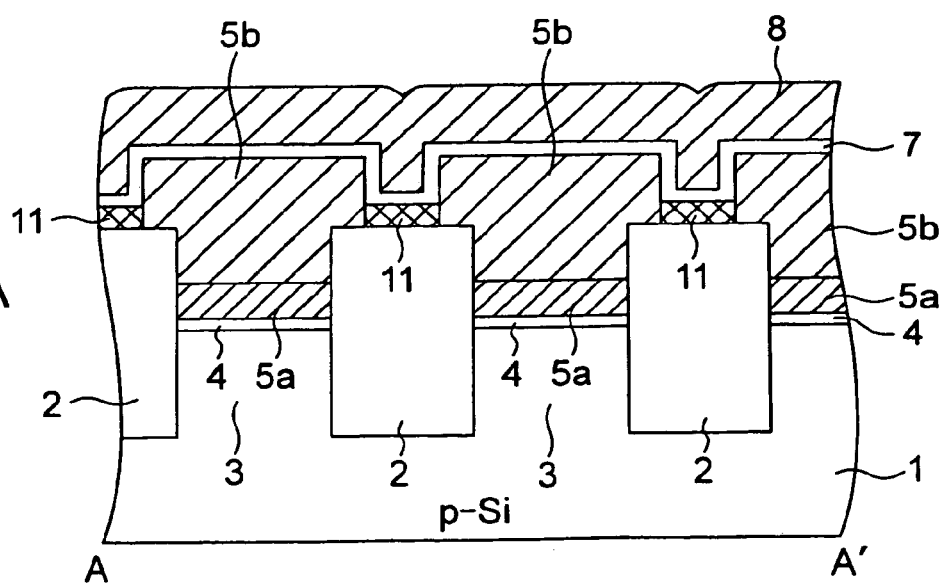
FIGS. 18A to 18C are sectional views taken along the lines A–A', B–B' and C–C', respectively, illustrating the gate electrode patterning step for forming the memory cell array in the second embodiment.
Figure 18B:
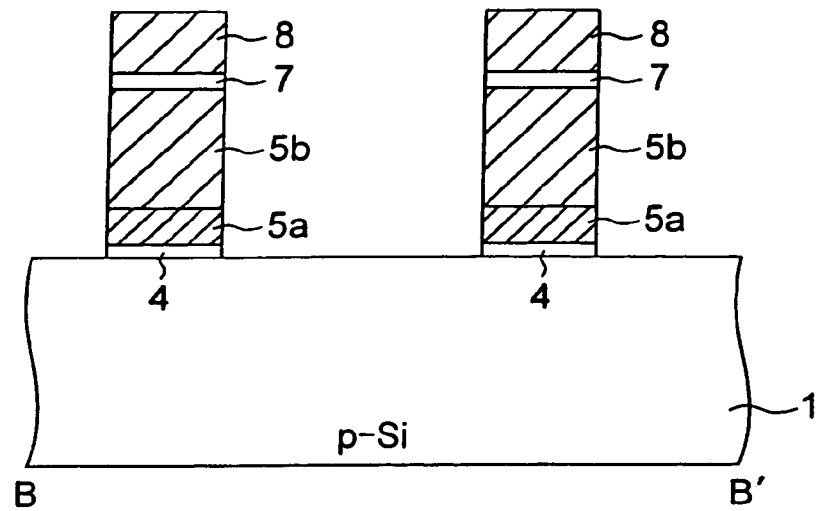
Figure 18C:
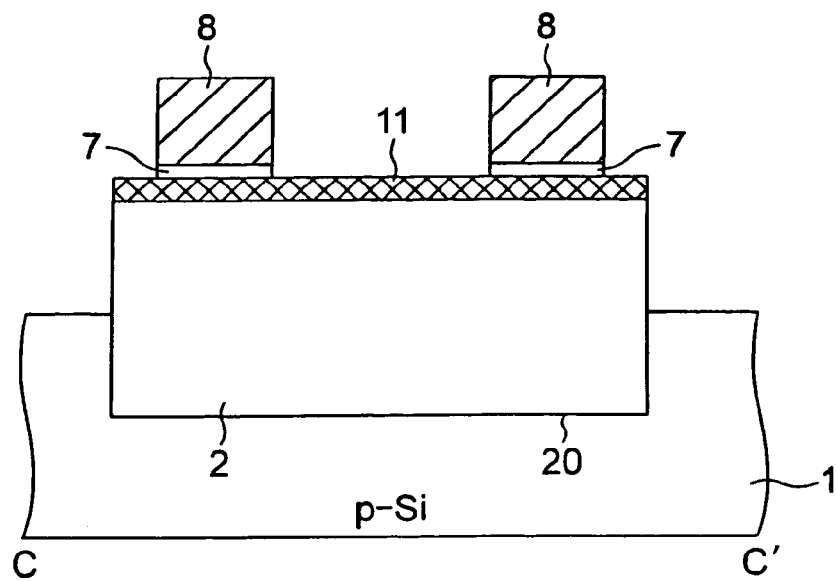

In the this embodiment, the gate embedding-oriented insulating film 22 is, as described above, removed after providing the floating gate 5, however, the protective insulating film 11 is left as it is on the isolation insulating film 2. Thereafter, as shown in FIGS. 17A to 17C, an ONO layer as a second gate insulating film 7 is provided on the entire surface, and a third gate material layer 8a is deposited thereon. The third gate material layer 8a may include a polycrystalline silicon layer, a stacked layer of the polycrystalline silicon layer and a metal layer, a metal silicide layer, a salicide layer etc. Thereafter, the third gate material layer 8a is etched and, as shown in FIGS. 18A to 18C, formed in pattern as the control gate serving as the word line WL continuous in the x-direction. Simultaneously, the floating gate 5 thereunder is formed in pattern in self-alignment with the control gate 8. A position of the upper surface of the floating gate 5 is higher than a position of the upper surface of the protective insulating film 11 on the isolation insulating film 2. Accordingly, the control gate 8 is provided extending to not only the upper surface of the floating gate 5 but also to side surfaces thereof through the second gate insulating film 7.

Thereafter, as illustrated in FIGS. 11A to 11C, the diffused layer 6 is provided. Then, the inter-layer insulating film 9 is deposited, a contact hole is formed, and a bit line 10 is arranged.

As discussed above, according to the this embodiment, each of the floating gates 5 is isolated on the isolation insulating film 2 not by etching the gate material layer but by embedding the gate material layer based on the Damascene method. The isolation insulating film is not therefore formed with the trench as in the case of effecting the slit processing of the gate material layer on the isolation insulating film as done in the prior art. This restrains a short-circuit defect occurred between the control gates.

Figure 15A:
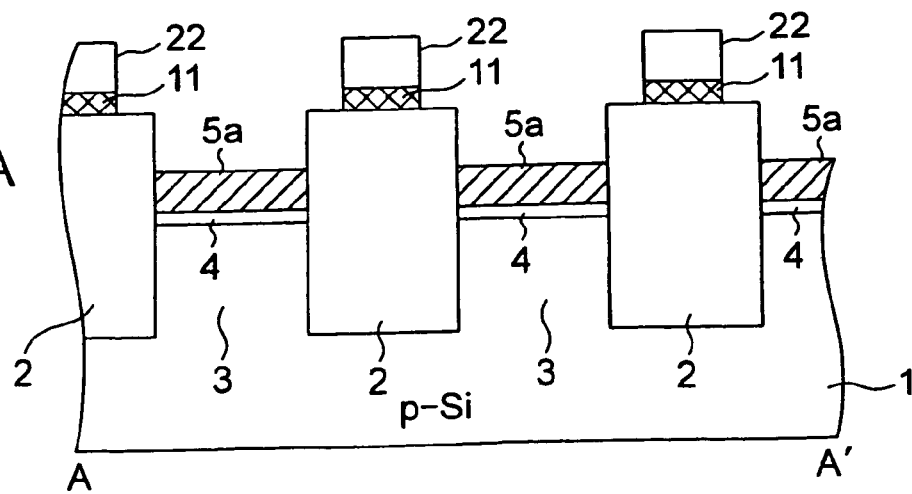
FIGS. 15A to 15C are sectional views taken along the lines A–A', B–B' and C–C', respectively, illustrating the steps of forming the protective insulating film pattern for forming the memory cell array in the second embodiment.
Figure 15B:
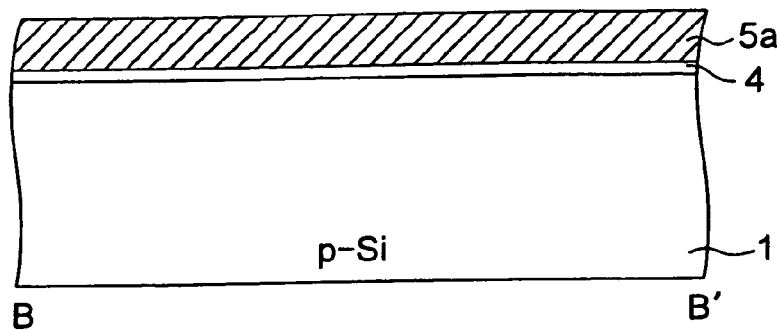
Figure 15C:
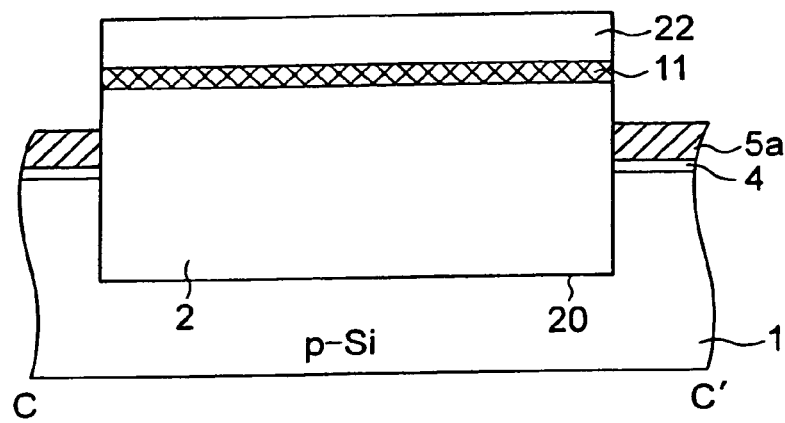

Further, FIGS. 15A to 15C show processes of removing the masking material used for the isolation trench processing, wherein the isolation insulating film 2 is protected by the protective insulating film 11 and the masking material 22, with the result that the layer reduction of the isolation insulating film 2 is prevented. Moreover, a patterning process, shown in FIGS. 18A to 18C, of the control gate 8 and the floating gate 5 embraces an etching process for the gate insulating film 7 composed of the ONO layer, however, at this time also, as obvious from FIG. 9C, the surface of the isolation insulating film 2 is protected by the protective insulating film 11, thereby preventing the layer reduction of the isolation insulating film 2.

Note that the protective insulating film 11 on the isolation insulating film 2 in the second embodiment discussed above is left without being all removed to the end, however, after removing the gate embedding-oriented insulating film 22 in the state shown in FIG. 13B, subsequently the protective insulating film 11 inclusive may be removed. In this case, there occurs the layer reduction of the isolation insulating film 2 in the pattern process of the control gate 8 and the floating gate 5, especially in the process of etching the gate insulating film 7. Unlike the prior art method wherein the trench is formed on the isolation insulating film before depositing the gate material layer, however, the trench is never formed in the isolation insulating film 2 at least when depositing the gate material, and hence there is obtained an effect of preventing the short-circuit accident between the control gates.

Figure 19A:
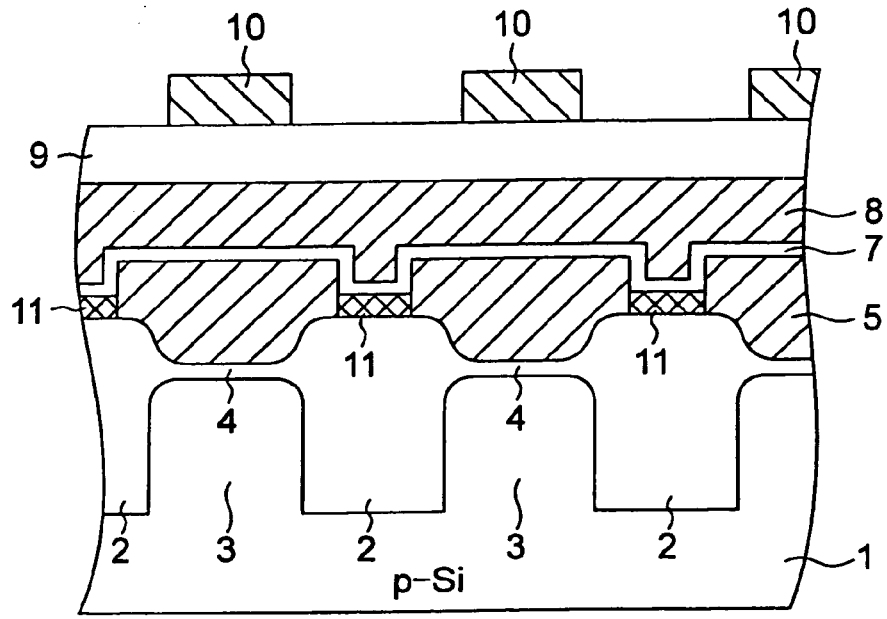
FIGS. 19A and 19B are sectional views, corresponding to FIGS. 11A and 11B, showing the memory cell array of the EEPROM in the third embodiment of the present invention.
Figure 19B:
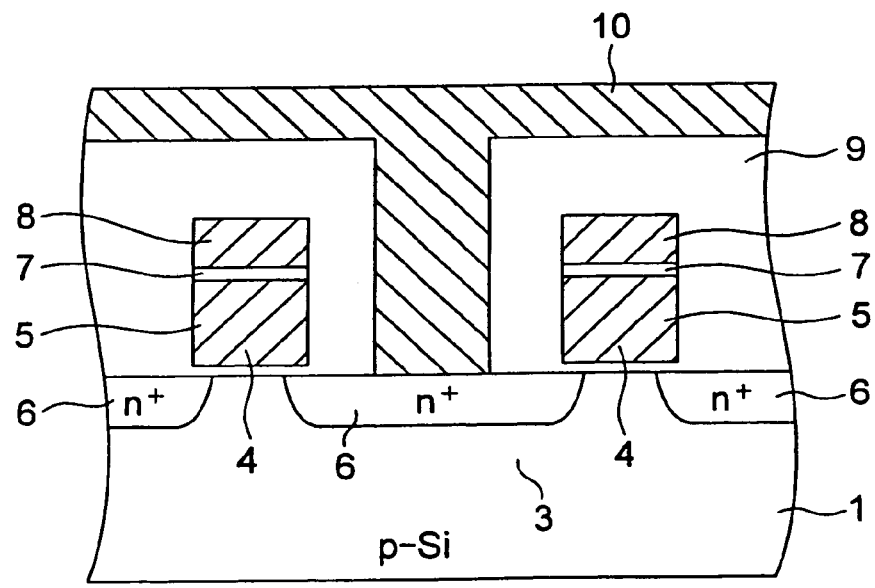

FIGS. 19A and 19B each show a sectional structure of the EEPROM cell array in the second embodiment, corresponding to FIGS. 11A and 11B. The conditions for the isolation process and the gate forming process in this embodiment are different from those in the previous embodiment. A corner of the upper edge of the device forming region 3 is rounded in this embodiment. The basic structure is, however, the same as the former embodiments, and the plan view thereof has no difference from FIG. 10.

To be specific, a manufacturing process in the third embodiment will be explained referring to FIGS. 20A to 20F.

Figure 20A:
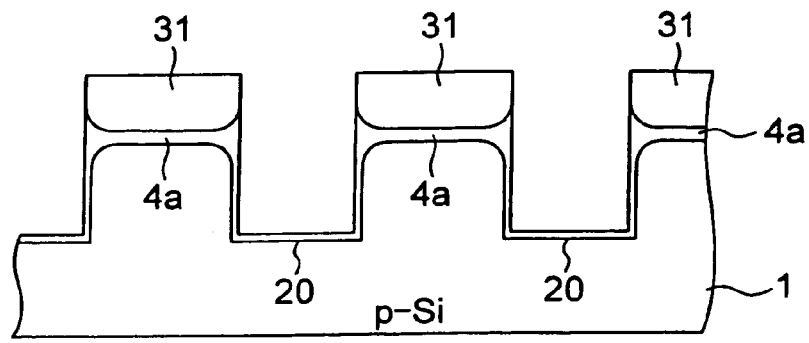
FIGS. 20A to 20F are sectional views illustrating the steps of manufacturing the memory cell in the third embodiment.

As shown in FIG. 20A, a masking material 31 for the isolation processing is provided in pattern via a sacrifice oxide layer 4a on the surface of a p-type silicon substrate 1. The masking material 31 is composed of polycrystalline silicon in the third embodiment. The substrate is etched by RIE with the masking material 31, to form an isolation trench 20.

Figure 20B:
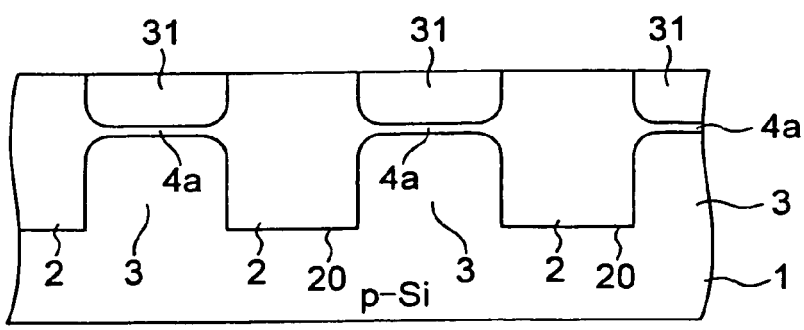

Next, simultaneously when an oxide layer is formed on an exposed surface of the isolation trench 20 by effecting thermal oxidation, a bird's beak oxide layer encroaches along the upper portion of the device forming region 3, and the rounding process is effected thereon. Thereafter, as shown in FIG. 20B, the silicon oxide layer as the isolation insulating film 2 is buried flat like the previous embodiment. For attaining the flattened surface, the silicon oxide layer is deposited equal to or thicker than a trench depth, and, the CMP process is executed to this layer, wherein the masking material 31 composed of a polycrystalline silicon layer is used as a stopper.

Figure 20C:
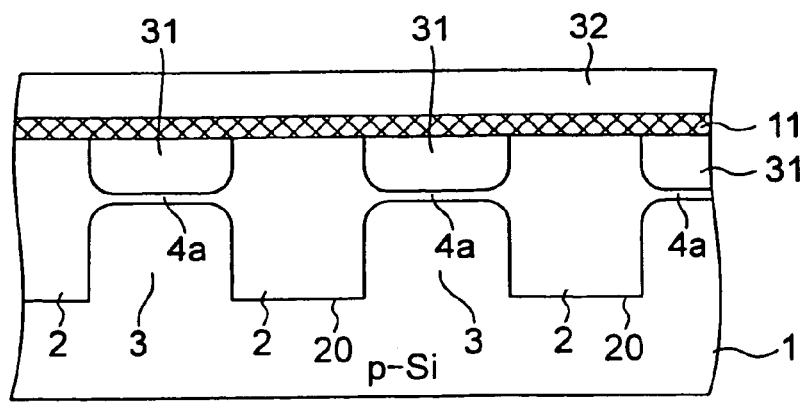
Figure 20D:
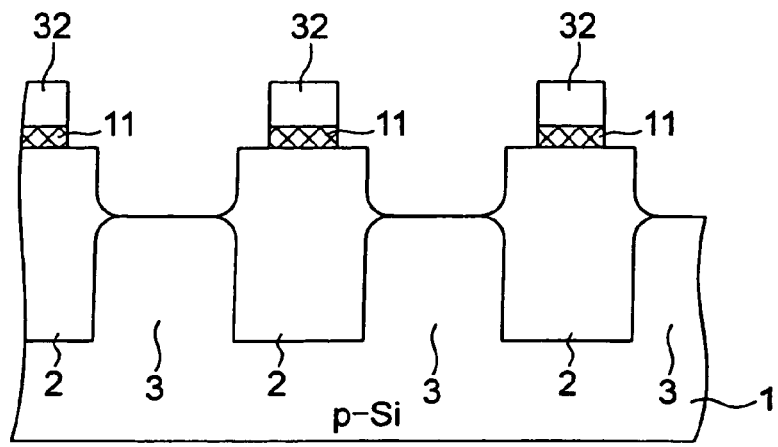

Next, as shown in FIG. 20C, the protective insulating film 11 for protecting the isolation insulating film 2 is deposited on the substrate that has been subjected to the isolation process and flattened, and further a gate embedding-oriented insulating film 32 for forming the floating gates to be isolated is deposited thereon. To be more specific, the protective insulating film 11 is a silicon nitride layer, and the gate embedding-oriented insulating film 32 is a TEOS oxide layer. Thereafter, as illustrated in FIG. 20D, the gate embedding-oriented insulating film 32 is provided as a mask pattern continuous in the y-direction in FIG. 10 on the isolation insulating film 2 by the lithography and etching. Then, the protective insulating film 11 is etched with this gate embedding-oriented insulating film 32 serving as a mask, and further masking material 31 existing on the device forming region is removed by etching.

Figure 20E:
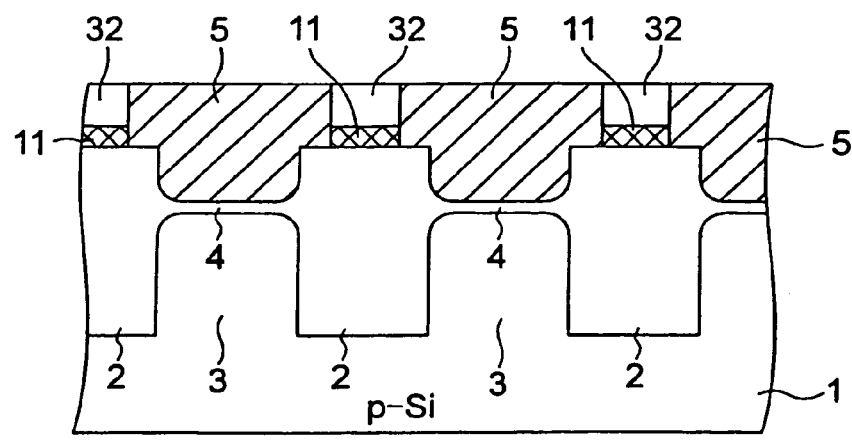

Thereafter, the polycrystalline silicon layer as a first gate material layer is deposited thick over the whole surface and flattened by the CMP process with the gate embedding-oriented insulating film 32 as a stopper. The floating gates 5 are thereby provided, as shown in FIG. 20E, in a state of being isolated by the gate embedding-oriented insulating film 32 on the isolation insulating film 2 in the x-direction. Thereafter, the gate embedding-oriented insulating film 32 is removed by wet etching using hydrofluoric acid etc. As a result, there occurs a state in which the floating gates 5 are isolated on the isolation insulating film between the adjacent memory cells with the isolation insulating film being sandwiched in therebetween, and the protective insulating film 11 is disposed at the isolated portion of the floating gates 5.

Figure 20F:
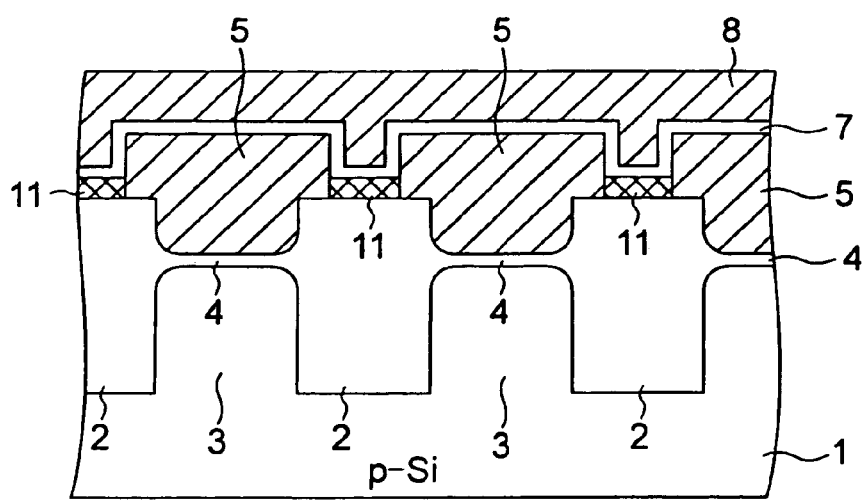

The gate embedding-oriented insulating film 32 is as described above removed after providing the floating gates 5, however, the protective insulating films 11 are left as they are on the isolation insulating film 2. Hereafter, as shown in FIG. 20F, the control gate 8 is formed by depositing a second gate material layer through an ONO layer serving as a second gate insulating film 7. The second gate material layer may be a polycrystalline silicon layer, a stacked layer of the polycrystalline silicon layer and a metal layer, a metal silicide layer, a salicide layer etc. The control gate 8 is, as shown in FIG. 10 or 11B, provided in pattern as the word line WL continuous in the x-direction, and at the same time the floating gates 5 thereunder are also provided in pattern in self-alignment with the control gates 8. A position of the upper surface of the floating gate 5 is higher than a position of the upper surface of the protective insulating film 11 on the isolation insulating film 2. Accordingly, the control gates 8 are provided extending to not only the upper surface of the floating gate 5 but also to side surfaces thereof through the second gate insulating film 7.

In accordance with the this embodiment, the floating gates 5 are formed through the first gate insulating film 4 after the isolation, however, the layer reduction of the isolation insulating film 2 is prevented in the process of peeling off the masking material owing to the protective insulating film 11 disposed on the isolation insulating film 2. Further, the layer reduction of the isolation insulating film 2 is prevented in the process of providing the stacked gate structure. These effects are the same as those in the previous embodiment.

Figure 21A:
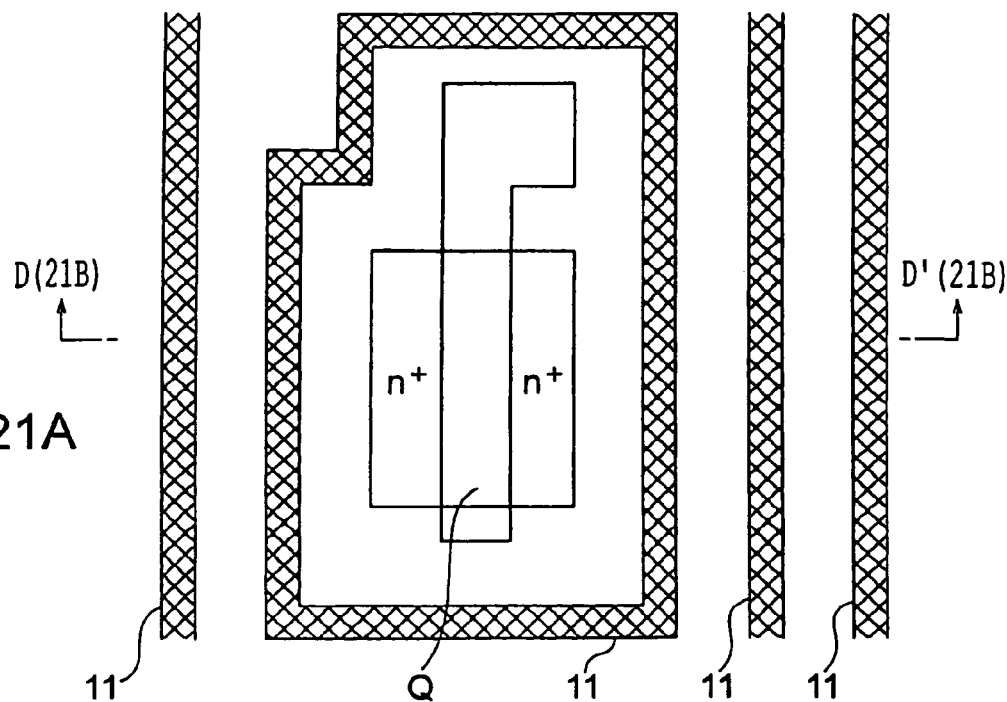
FIGS. 21A and 21B are a plan view and a sectional view, respectively, showing a configuration of a peripheral circuit transistor area of the EEPROM of the present invention.
Figure 21B:
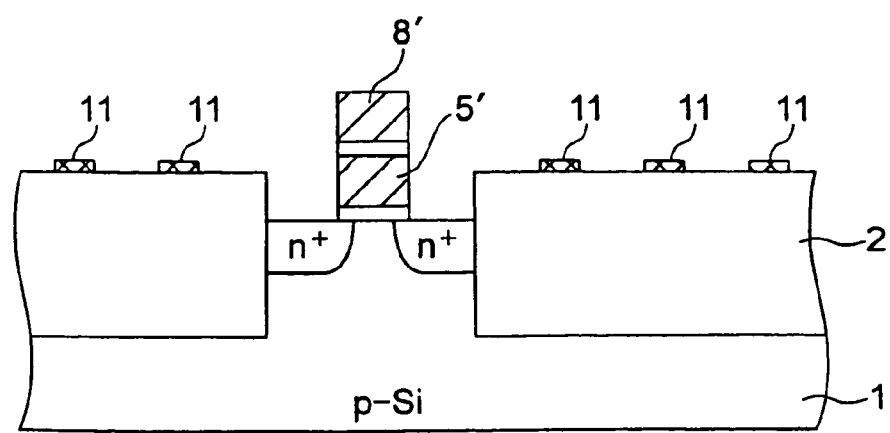

In accordance with the first and second embodiments, only the memory cell array area has been explained, however, the peripheral circuit provided simultaneously with the memory cell array takes preferably a structure as shown in FIGS. 21A and 21B. FIGS. 21A and 21B are a plan view showing one peripheral circuit transistor Q and a peripheral portion thereof, and a sectional view taken along the line D–D'. Namely, the same protective insulating film 11 as the protective insulating film 11 provided on the isolation insulating film 2 in the memory cell array area, is provided in a dummy pattern, e.g., in a cyclical pattern along the peripheral circuit transistor Q on the isolation insulating film 2.

A gate of the peripheral circuit transistor Q is, as in the case of the memory cell array area, constructed taking a stacked structure of a first gate 5' and a second gate 8' that are stacked via the gate insulating film and short-circuited in a proper position. In this case, the first gate 5' is, as explained in the second and third embodiments, subjected to the flattening/embedding process based on the Damascene method.

In the flattening process based on the CMP process, it is known that polishing advances fast in an area having a large embedding space with no uniform flattening. As shown in FIG. 21A, when the protective insulating film 11 is provided as the dummy pattern along the transistor Q, in the process polishing and embedding material layer of the gate 5' formed simultaneously with the floating gate 5 of the memory cell, the protective insulating film 11 becomes a stopper, thus the flattening with high uniformity can be attained.

The present invention is not limited to the embodiments discussed above. For instance, the embodiments have dealt with the NOR type EEPROM, however, the present invention can be similarly applied to other EEPROMs such as a NAND type, an AND type, a DINOR type etc each having the non-volatile memory cells taking the stacked layer gate structure of the charge-storage layer and the control gate.

As discussed above, according to the present invention, variation in the capacitance-coupling that would be caused when making the memory cells hyperfine, is restrained small by flattening the surface of the floating gate, whereby the EEPROM capable of exhibiting the excellent data reprogramming performance can be obtained. Further, the protective insulating film is disposed on the isolation insulating film between the memory cell, thereby making it feasible to prevent both of the layer reduction of the isolation insulating film for separating the charge-storage layer and the gate-to-gate short-circuit defect, to obtain the EEPROM including the hyperfine-structure memory cells.

Figure 22A:
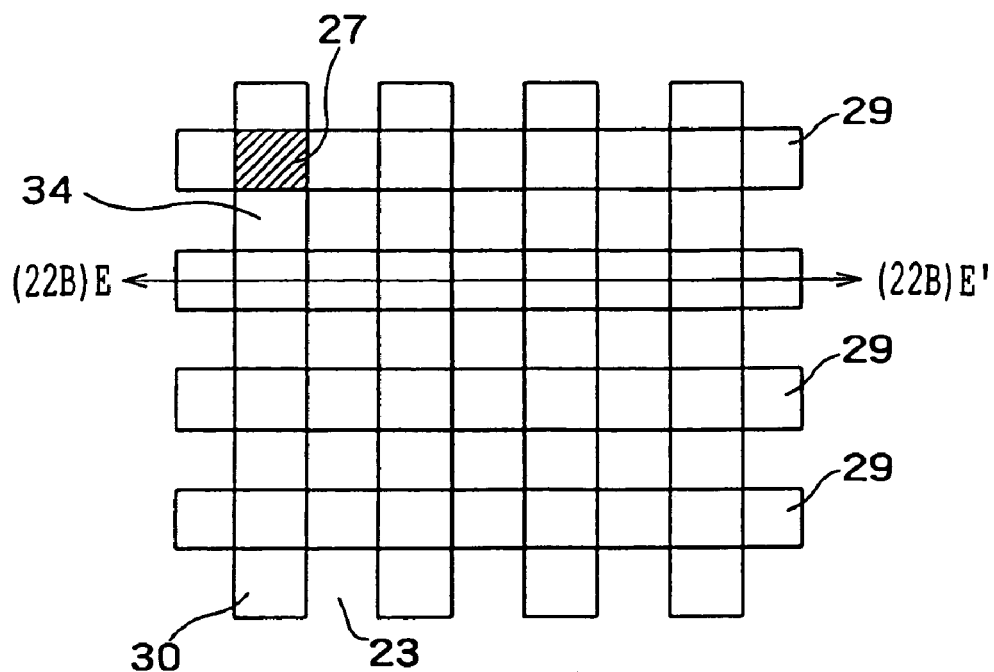
FIGS. 22A and 22B are a plan view and a sectional view, respectively, illustrating a fourth embodiment of a non-volatile semiconductor memory device according to the present invention.
Figure 22B:
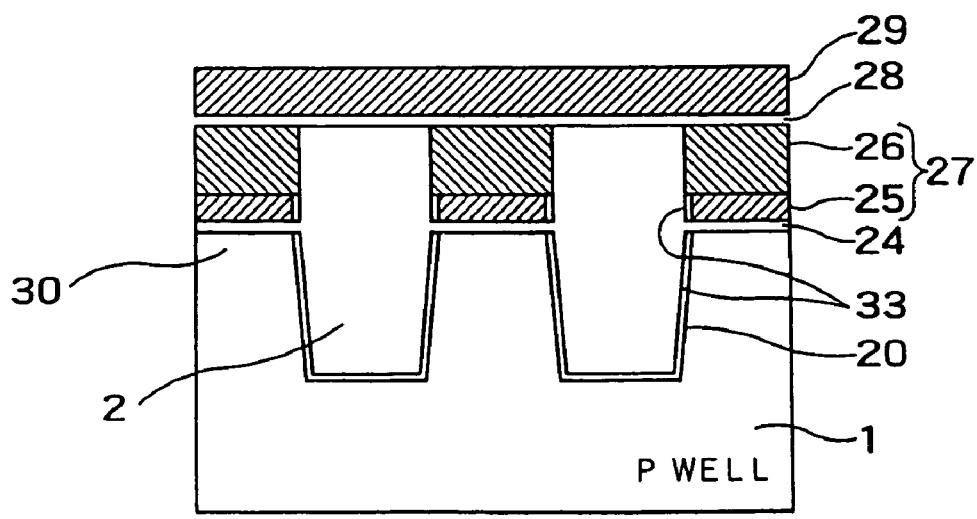

FIGS. 22A and 22B illustrate a memory cell structure as the fourth embodiment according to the present invention. FIG. 22A is a plan view and FIG. 22B is a sectional view taken along the line E–E'.

Isolation trenches 20 are formed in a p-type silicon substrate, or a p-well 1. Each isolation trench 20 is filled with an isolation insulating material, such as, silicon dioxide, to form an isolation insulating film 2.

Formed on the entire surface of a channel region 30 on the substrate that has been subjected to isolation is a silicon dioxide film having a thickness of 150 angstrom or less as a thin tunnel-insulating film 24 through which a tunnel current will flow. Formed on the tunnel-insulating film 24 is a first conductive layer 25, the side wall thereof being flush with the end of the isolation region.

An oxide film 33 is formed in each trench 20 and on the side wall of the first conductive layer 25 at the isolation region side. This oxide film is not shown in the figures that follows FIG. 22B for brevity.

Formed on the first conductive layer 25 is a second conductive layer 26 so that they touch each other. The side wall of the second conductive layer 26 is stretched out a little bit compared to the first conductive layer 25. The first conductive layer 25 and the second conductive layer 26 are stacked to form a charge-storage layer 27.

The upper surface of an isolation insulating film 23 is flush with that of the charge-storage layer 27. Formed on these upper surfaces is a control gate 29 via a gate-to-gate insulating film 28.

As illustrated in FIG. 22A, the control gate 29 and the charge-storage layer 27 are formed by self-alignment so that their side walls are flush with each other in the vertical direction. An n-type diffused layer 34 is formed between the gates.

FIGS. 23A to 23D are sectional views each illustrating a step of manufacturing the self-alignment-type STI-cell structure shown in FIGS. 22A and 22B.

Figure 23A:
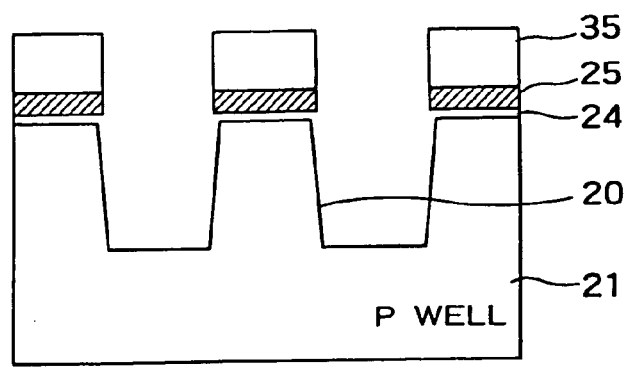
FIGS. 23A to 23D are sectional views each illustrating a step of manufacturing the structure shown in FIGS. 22A and 22B.

The tunnel insulating film 24 is formed on the semiconductor substrate 1. An impurity-doped polysilicon layer is deposited by CVD on the tunnel insulating film 24, as the first conductive layer 25. Deposited thereon further is a resist as a masking material 35. The masking material 35, the first conductive material 25, the tunnel-insulating film 24 and the semiconductor substrate 21 in the isolation region are etched so that their side walls are flush with each other to form the trenches 20 (FIG. 23A).

Figure 23B:
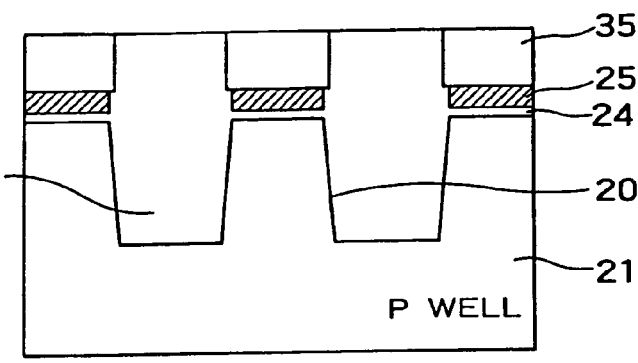

The side walls of the trenches 20 and the first conductive layers 25 are oxidized by oxidation or surface adulteration with deposition of the isolation insulating film 2 thereon. The isolation insulating film 2 is flattened by etch-back in dry etching or polished by chemical-mechanical polishing (CMP), finally the upper surface of the masking material 35 being exposed (FIG. 23B).

Figure 23C:
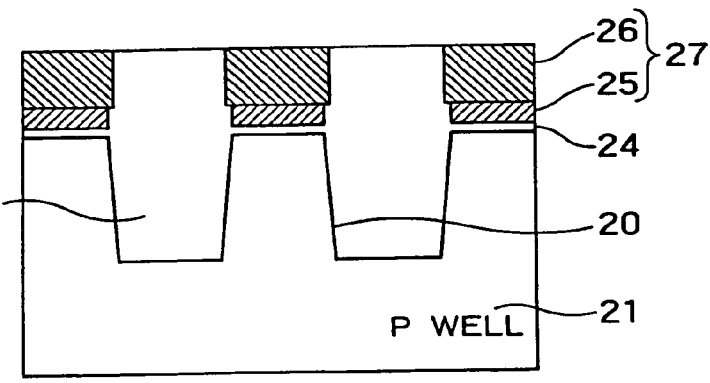

The masking material 35 is peeled-off to expose the upper surface of the first conductive layer 25, with deposition of the second conductive layer 26 made of an impurity-doped polysilicon layer on the entire surface thereof. The second conductive layer 26 is etched back or polished to be flat until the isolation insulating film 23 is exposed for isolation of the second conductive layer 26 (FIG. 23C). The first conductive layer 25 and the second conductive layer 26 act as the charge-storage layer 27, as already discussed.

Figure 23D:
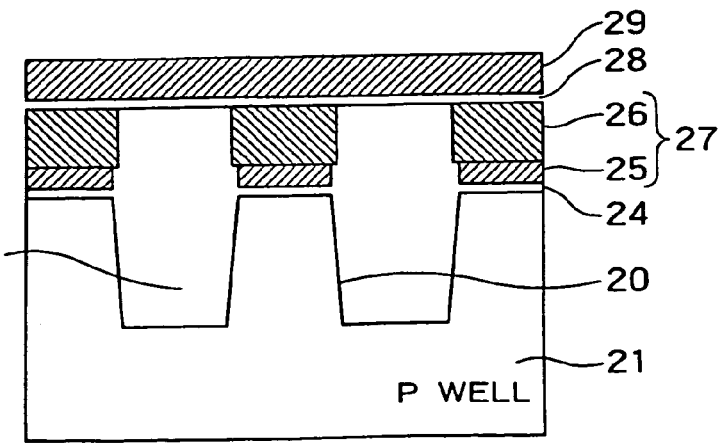

The gate-to-gate insulating film 28 and the control gate 29 are deposited thereon with gate formation to finish fabrication of the cell structure (FIG. 23D).

In the structure fabricated as above, the second conductive layer 26 is little bit wider than the first conductive layer 25 because the side wall of the first conductive layer 25 falls back little bit by oxidation after formation of the trenches.

The upper surface of the first conductive layer 25 is cleaned by chemical treatment while the second conductive layer is deposited. This treatment could form a thin oxide film on the first conductive layer 25, or between the first and the second conductive layer 25 and 26. This oxide film is extremely thin, thus causing no problem on electrical conduction; hence the first and the second conductive layer 25 and 26 are kept at the same potential.

The first embodiment disclosed above has the following advantages:

The second well-known STI-cell structure has a problem in a high aspect ratio for filling the trenches with the isolation insulating film. Contrary to this, in this invention, the aspect ratio for burying the isolation insulating film is decided according to the thickness of the first conductive layer and also the masking material because the first and the second conductive layers are stacked each other to form the charge-storage layer. The present invention achieves a low aspect ratio in burying by having the first conductive layer thinner than the second conductive layer. Suppose that a trench depth is 0.3 µm and the charge-storage layer is 0.15 µm in thickness. The aspect ratio 2 for burying an isolation insulating film with no voids offers 0.225 µm-wide isolation in burying when the thickness of the masking material and the first conductive layer are 0.1 µm and 0.05 µm, respectively. The present invention thus achieves miniaturized isolation width compared to the second well-known STI-cell structure.

Moreover, stacking the second conductive layer 26 on the first conductive layer 25 offers an appropriate thickness to the charge-storage layer 27 required for gate formation. The overall resistance of the charge-storage layer 27 can be decreased with decreasing impurity density in the first conductive layer 25 that forms the first gate insulating film interface.

Furthermore, enough deposition of the second conductive layer 26 achieves rough surface treatment to the charge-storage layer 27 after burying isolation film in which the upper surface of the charge-storage layer 27 is formed in rough to attain a large capacity between the charge-storage layer 27 and the control gate 29.

The thin first conductive layer 25 offers ion injection therethrough for impurity doping to the semiconductor substrate under the gate electrode for control of a threshold voltage of memory cell or transistor, by which ion injection can be performed after a highly thermal processing, such as, thermal oxidation, required for formation of gate insulating film, thus achieving a precise control of impurity profile in a semiconductor substrate.

The fourth embodiment of memory cell has a flat uppermost surface to the charge-storage layer 27 in the entire cell array, thus restricting variation in capacity due to variation in surface area of the charge-storage layer. The fourth embodiment thus offers memory cells having almost the same reprogramming characteristics.

Figure 24:
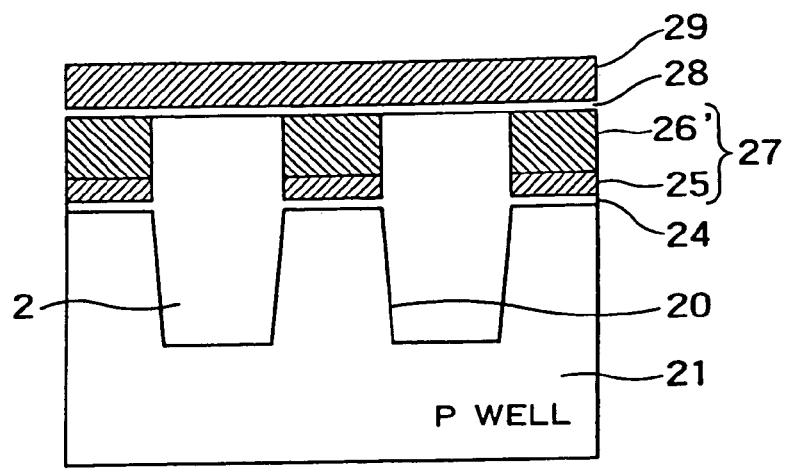
FIG. 24 is a sectional view illustrating a modification to the structure shown in FIG. 23A.

The device illustrated in FIG. 24 has almost the same structure as that shown in FIG. 22B, except that the side walls of the first conductive layer 25 and a second conductive layer 26' that constitute the charge-storage layer 27 are flush with each other, that is, both layers have the same width. This structure is attained by combination of requirements and material for the first conductive layer 25 that will fall back very little on etching for forming the trenches 23 or surface adulteration other than oxidation, which will not cause falling back of the first conductive layer.

This structure is a self-alignment structure with no steps, thus improving characteristics with smooth charge movement while less generation of parasitic capacitance.

Figure 25A:
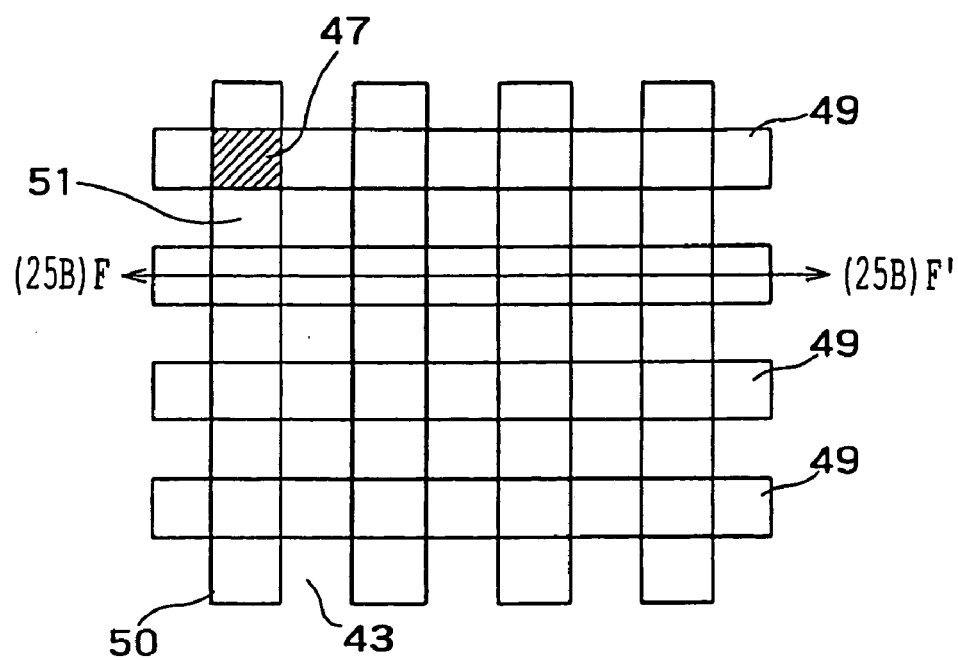
FIGS. 25A and 25B are a plan view and a sectional view, respectively, illustrating a fifth embodiment of a non-volatile semiconductor memory device according to the present invention.
Figure 25B:
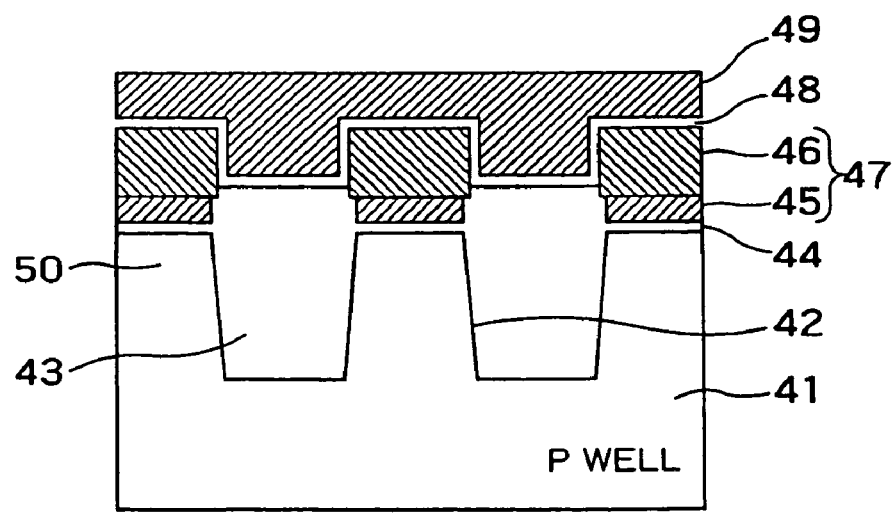

FIGS. 25A and 25B illustrate a cell structure for a non-volatile semiconductor memory device as the fifth preferred embodiment according to the present invention. FIG. 25A is a plan view and FIG. 25B is a sectional view taken along the line F–F'.

Isolation trenches 42 are formed in a p-type silicon substrate, or a p-well 41. Each isolation trench 42 is filled with an isolation insulating material, such as, silicon dioxide, to form an isolation insulating film 43. Formed on the entire surface of a channel region on the substrate that has been subjected to isolation is a thin tunnel-insulating film 44 through which a tunnel current will flow. Formed on the tunnel-insulating film 44 is a first conductive layer 45, the side wall thereof being flush with the end of the isolation region 43.

Formed on the first conductive layer 45 is a second conductive layer 46 so that they touch each other. The side wall of the second conductive layer 46 is stretched out a little bit compared to the first conductive layer 45. The first conductive layer 45 and the second conductive layer 46 are stacked to form a charge-storage layer 47.

The upper surface of the isolation insulating film 43 is little bit higher than the lower surface of the second conductive layer 46. A gate-to-gate insulating film 48 is formed on the upper surface of the second conductive layer 46 and on the side wall thereof but only on the portion higher than the gate-to-gate insulating film, and also on a portion of the isolation insulating film 43. A control gate 49 is formed on the gate-to-gate insulating film 48. As illustrated in FIG. 25A, the control gate 49 and the charge-storage layer 47 are formed by self-alignment so that their side walls are flush with each other in the vertical direction. An n-type diffused layer 51 is formed between the gates.

FIGS. 26A to 26D are sectional views each illustrating a step of manufacturing the STI-cell structure shown in FIGS. 25A and 25B.

Formed on the semiconductor substrate 41 is the tunnel-insulating film 44, followed by deposition thereon of the first conductive layer 45 and the masking material 52. The masking material 52, the first conductive material 45, the tunnel-insulating film 44 and the semiconductor substrate 41 in the isolation region are etched so that their side walls are flush with each other to form trenches 42.

Figure 26A:
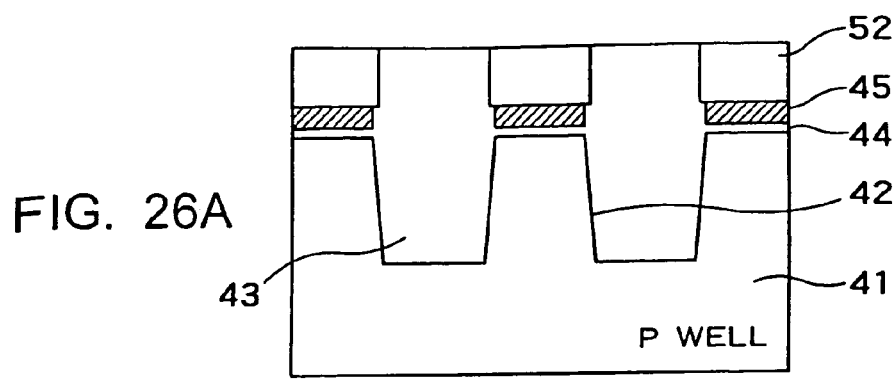
FIGS. 26A to 26D are sectional views each illustrating a step of manufacturing the structure shown in FIGS. 25A and 25B.

The side walls of the trenches 42 and the first conductive layers 45 are oxidized by oxidation or surface adulteration with deposition of the isolation insulating film 43 thereon. The isolation insulating film 43 is flattened by etch-back in dry etching or polished by chemical-mechanical polishing (CMP), finally the upper surface of the masking material 52 being exposed (FIG. 26A).

Figure 26B:
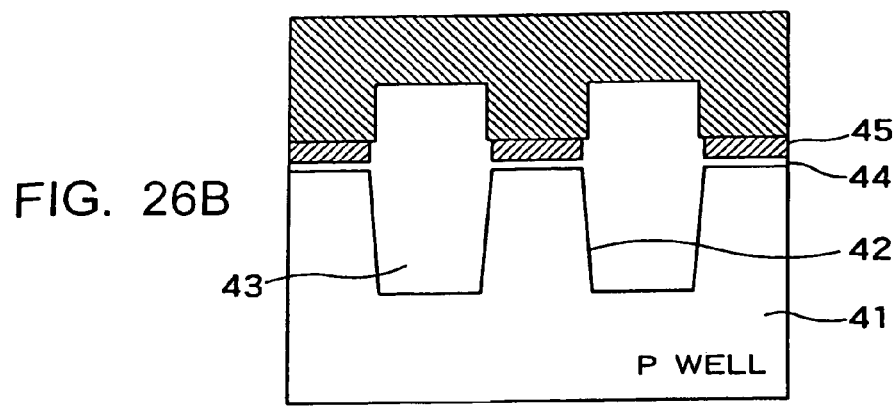

The masking material is peeled-off, followed by deposition of the second conductive layer 46 (FIG. 26B).

Figure 26C:
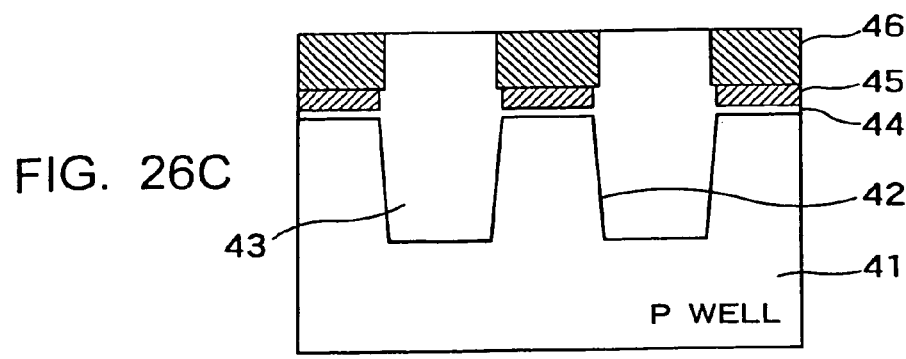

The second conductive layer 46 is etched back or polished to be flat until the isolation insulating film 43 is exposed for isolation of the second conductive layer 46 (FIG. 26C).

Figure 26D:
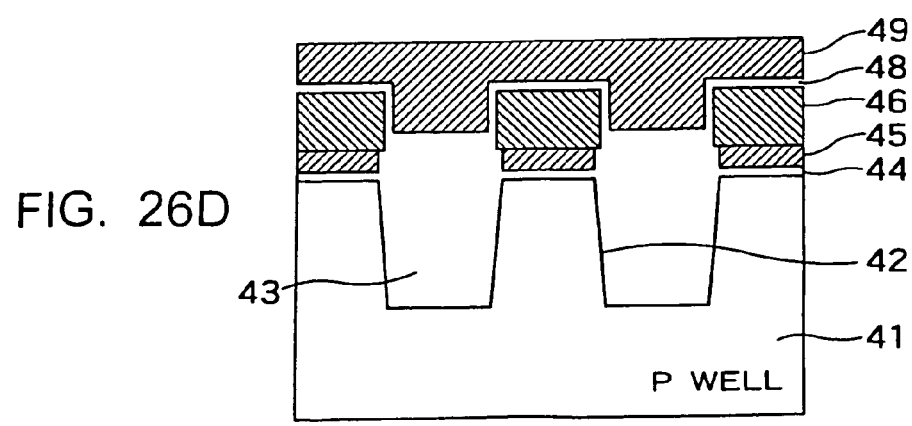

The isolation insulating film 43 only is etched until the upper surface thereof reaches a position within the thickness of the second conductive layer 46, the position corresponding, for example, to ⅓ or ¼ from the lower surface of the second conductive layer 46. The gate-to-gate insulating film 48 and the control gate 49 are deposited thereon with gate formation to finish fabrication of the cell structure (FIG. 26D).

The lower the upper surface of the isolation insulating film 43 under the second conductive layer 46, the larger the capacitance; the isolation insulating film 43 would, however, be formed unstable if it were low too much. These matters should be taken into consideration in deciding the position of the insulating film 43.

In the memory cell of the fifth embodiment, a side-wall portion of the second conductive layer 46 is exposed to face the control gate 49 for a high capacitance between the charge-storage layer 47 and the control gate 49. This structure thus achieves coupling-capacitance larger than that for the memory cell of the first embodiment. The step between the upper surface of the second conductive layer 46 and that of the isolation insulating film 48 can be set so that the charge-storage layer 47 and the control gate 49 have an enough area for facing each other to attain a desired capacitance. The step can also be uniform in the cell array. The second conductive layer 46 is preferably thicker than the first conductive layer 45 for ease of exposing a portion of the side wall.

Figure 27:
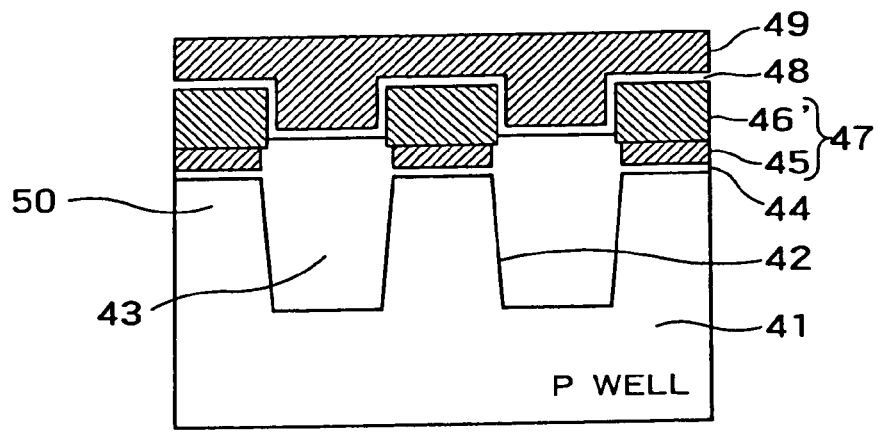
FIG. 27 is a sectional view illustrating a modification to the structure shown in FIG. 25A.

Illustrated in FIG. 27 is that the first and the second conductive layers 45 and 46 have the same width for self-alignment.

Figure 28A:
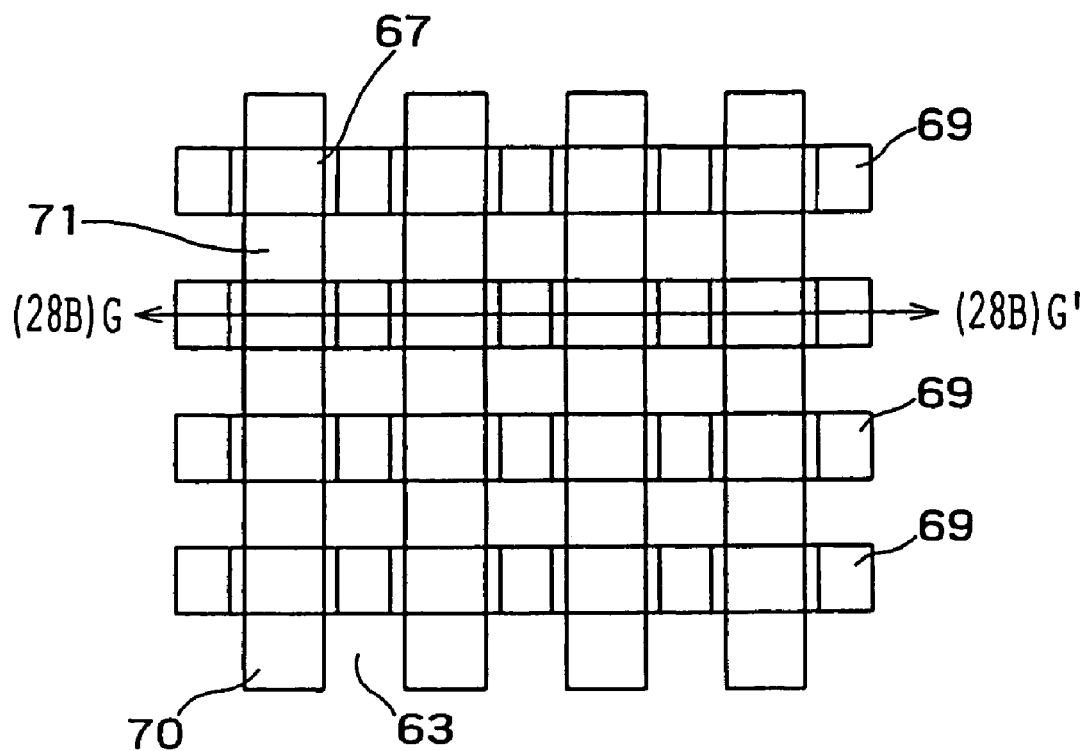
FIGS. 28A and 28B are a plan view and a sectional view, respectively, illustrating a sixth embodiment of a non-volatile semiconductor memory device according to the present invention.
Figure 28B:
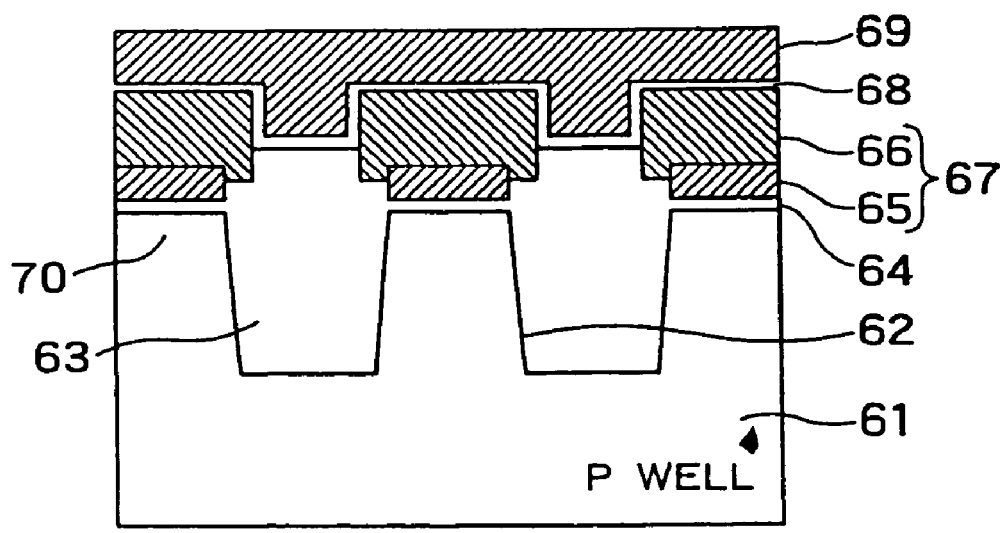

FIGS. 28A and 28B illustrate a cell structure for a non-volatile semiconductor memory device as the sixth embodiment according to the present invention. FIG. 28A is a plan view and FIG. 28B is a sectional view taken along the line G–G'.

This structure is similar to that for the second embodiment. Reference numerals for the components corresponding to those for the fifth embodiment are in sixties and seventies given by adding 20 to the corresponding reference numerals shown in FIGS. 25A and 25B. The difference between the fifth and sixth embodiments is that a second conductive layer 66 corresponding to the second conductive layer 46 in the fifth embodiment is much wider than a first conductive layer 65, which is clearly illustrated in FIGS. 28A and 28B.

FIGS. 29A to 29D are sectional views each illustrating a step of manufacturing the STI-cell structure shown in FIGS. 28A and 28B.

Figure 29A:
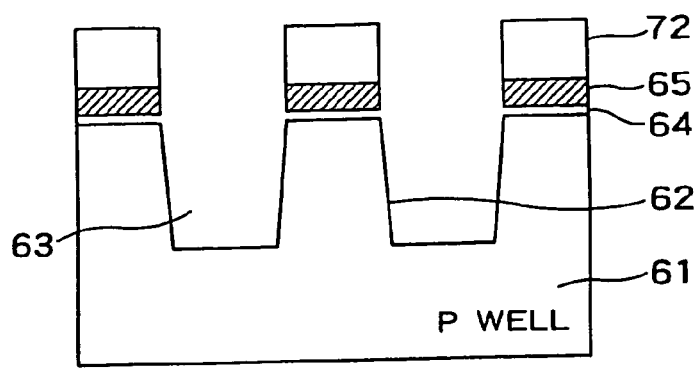
FIGS. 29A to 29D are sectional views each illustrating a step of manufacturing the structure shown in FIGS. 28A and 28B.

A tunnel-insulating film 64 is formed on a semiconductor substrate 61. The first conductive layer 65 and a masking material 72 are deposited thereon. The masking material 72, the first conductive material 65, a tunnel-insulating film 64 and the semiconductor substrate 61 in the isolation region are etched so that their side walls are flush with each other to form trenches 62. The side walls of the trenches 62 and the first conductive layers 65 are oxidized by oxidation or surface adulteration with deposition of an isolation insulating film 63 thereon. The isolation insulating film is flattened by etch-back in dry etching or polished by chemical-mechanical polishing (CMP), finally the upper surface of the masking material 72 being exposed (FIG. 29A).

Figure 29B:
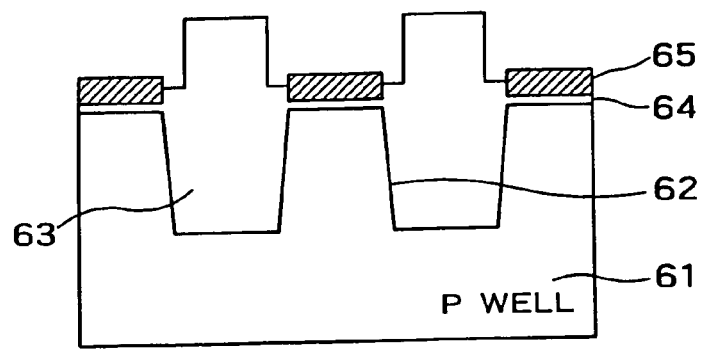

The masking material 72 is peeled off, followed by isotropic etching, such as wet etching, to the isolation insulating film in the lateral direction at a desired amount so that no isolation insulating film that is wider than the first conductive layer 65 remains on the first conductive layer 65 (FIG. 29B).

Figure 29C:
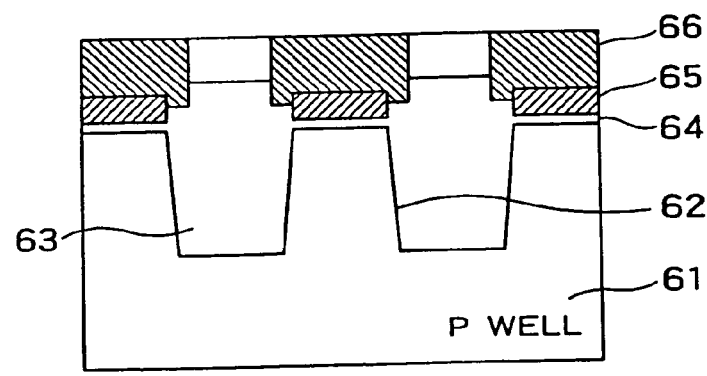

The second conductive layer 66 is deposited over the entire surface of the semiconductor substrate and etched back or polished to be flat until the isolation insulating film 63 is exposed for isolation of the second conductive layer (FIG. 29C).

The isolation insulating film 63 is etched back to be fell back under the second conductive layer 66 to expose the upper surface of the second conductive layer 66.

Figure 29D:
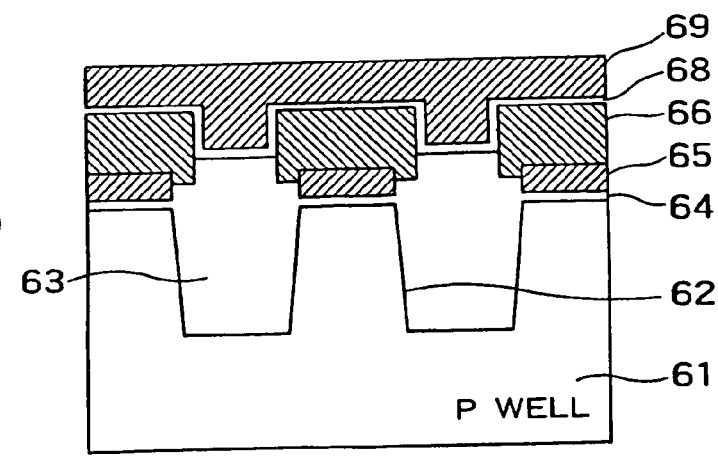

A gate-to-gate insulating film 68 and a control gate are deposited with gate formation to finish fabrication of the cell structure (FIG. 29D).

The third embodiment offers the second conductive layer wider than the first conductive layer, or device width by etching the isolation insulating film in the lateral direction at a desired amount after peeling off the masking material 72. The third embodiment thus offers capacitance between the charge-storage layer and the control gate larger than that for the memory cells in the first and the second embodiments.

Etching back the isolation insulating film 63 after flattening the second conductive layer 66 to expose a side-wall portion of the charge-storage layer 67 is a step for attaining a large capacitance between the control gate 69 and the charge-storage layer 67. This step can be omitted when a large capacitance between the control gate 69 and the charge-storage layer 67 can be attained with their areas facing each other at the upper surface of the charge-storage layer 67 only.

Figure 30A:
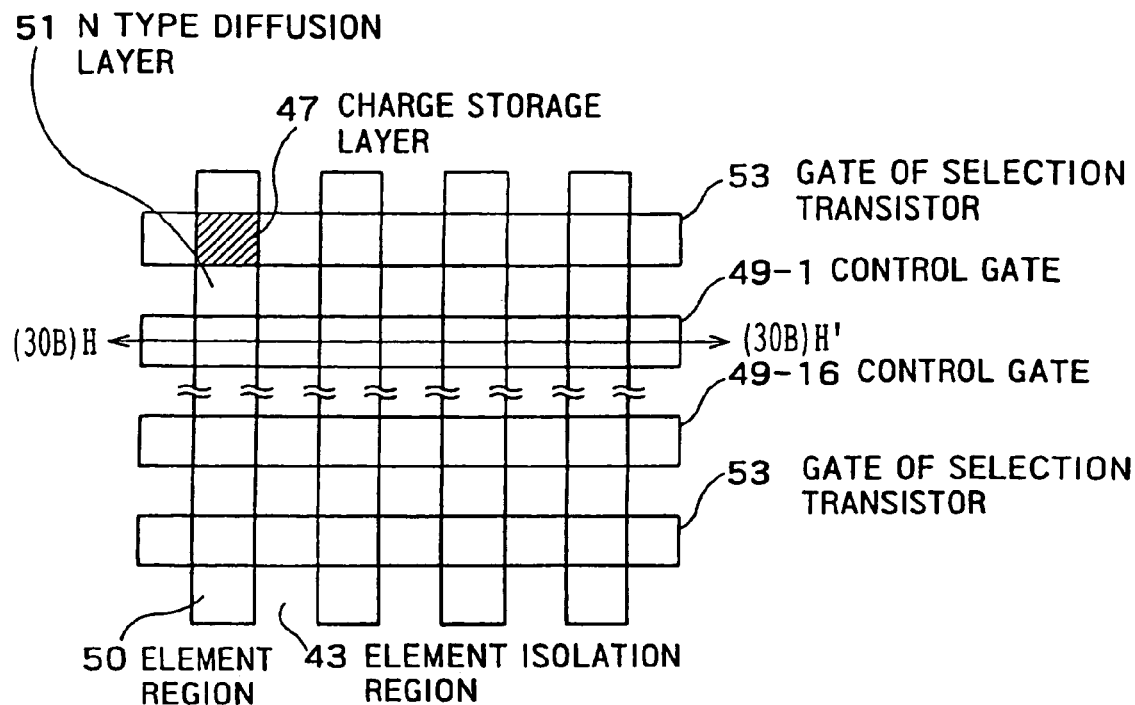
FIGS. 30A and 30B are a plan view and a sectional view, respectively, illustrating a seventh embodiment of a non-volatile semiconductor memory device according to the present invention.
Figure 30B:
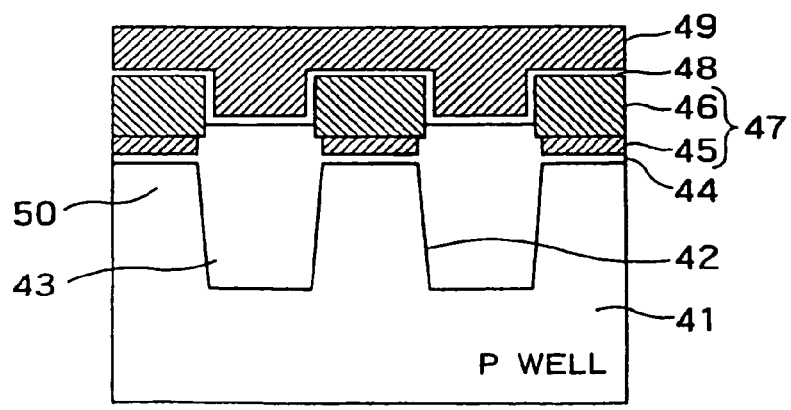

FIGS. 30A and 30B illustrate a non-volatile semiconductor memory device as the seventh embodiment according to the present invention. FIG. 30A is a plan view and FIG. 30B is a sectional view taken along the line F–F'.

The sectional view illustrated in FIG. 30B is completely same as that in FIG. 25B; hence elements in FIG. 30B that are identical to the elements in FIG. 25B are referenced by the same reference numerals and will not be explained in detail.

Disclosed in this embodiment is a NAND-type cell array. Series-connected 16 NAND cells are connected to bit and source lines via selection transistors 53. Each selection transistor is the same as the cells in material, film thickness, stacked-structure. The gate electrode of the selection transistors is in a floating state the same as the gate electrode called a charge-storage layer in the memory cells. The memory cells and the election transistors are the same in outward appearance because the charge-storage layers are not electrically connected to each other between transistors located between adjacent bits. A gate length may be different between the memory cells and the selection transistors. The selection transistors perform a usual transistor operation by voltage application to their control gates because a specific voltage is applied to the charge-storage layer due to capacitance-coupling between the charge-storage layer and the control gate. Having the same gate structure between the memory cells and the selection transistors eliminates some fabrication steps for the cell array, thus achieving fabrication of the memory cells with the minimum number of fabrication steps.

This structure can be applied to AND- and DINOR-types other than the NAND-type because their array structures have a unit of serial- or parallel-connected memory cells connected to bit or source lines via switching-selection transistors.

Figure 31:
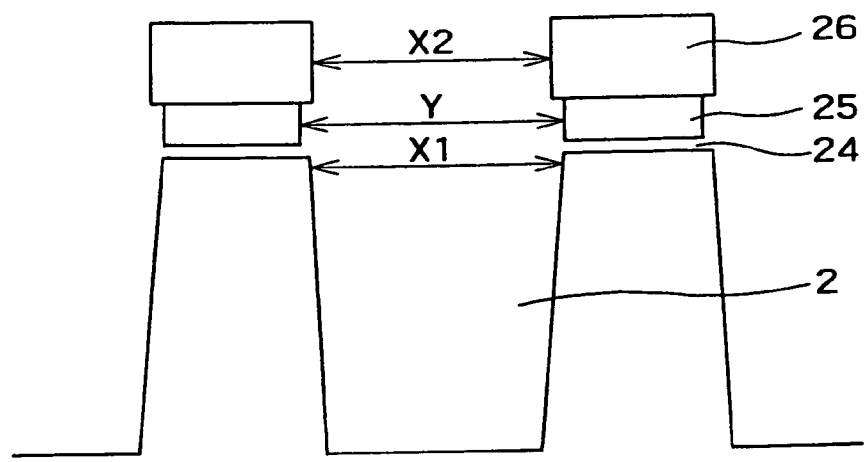
FIG. 31 is a device sectional view exhibiting general characteristics of a non-volatile semiconductor memory device according to the present invention.

FIG. 31 is a sectional view of a device for each embodiment illustrating the distances between side walls of adjacent isolation regions, between the uppermost layers of adjacent charge-storage layers and between the lowermost layers of the 00adjacent charge-storage layers.

The uppermost layer of the charge-storage layer wider than its lowermost layer as disclosed gives the following relationship:

$$Y>X1>X2 \text{ or } Y>X1=X2$$

where X1, Y and X2 denote the distances between side walls of the adjacent isolation regions, the lowermost layers of the adjacent charge-storage layers and the uppermost layers of the adjacent charge-storage layers, respectively.

Figure 32A:
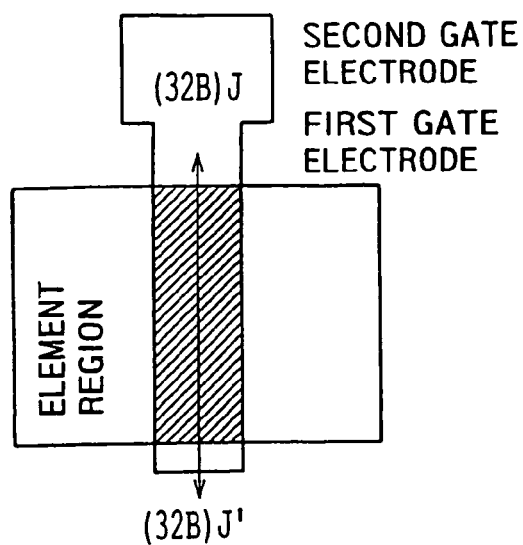
FIGS. 32A to 32D plan views and sectional views, respectively, illustrating a low-voltage transistor and a high-withstand voltage transistor used for a non-volatile semiconductor memory device as the eighth embodiment according to the present invention.
Figure 32C:
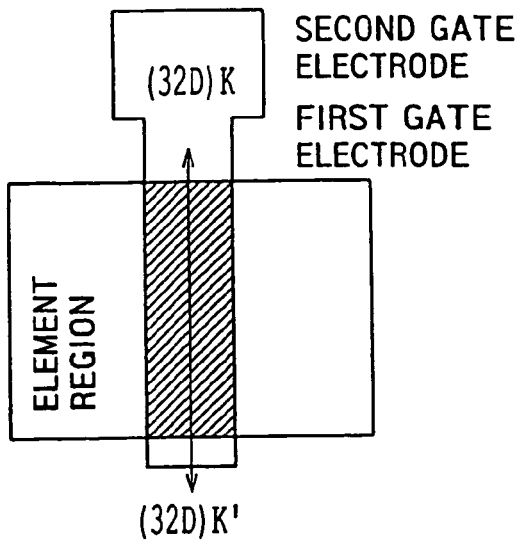
Figure 32B:
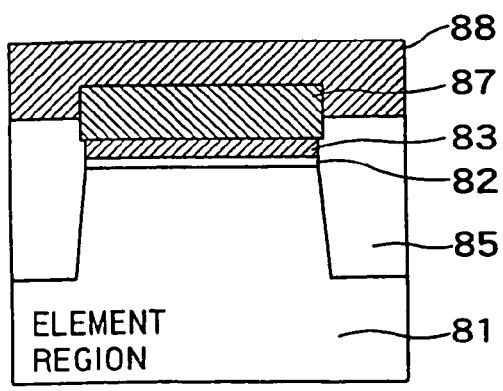
Figure 32D:
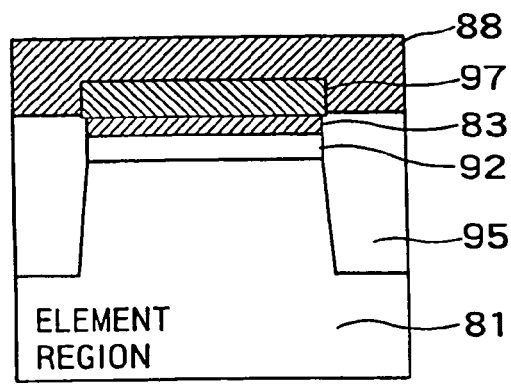

FIGS. 32A to 32D illustrate a non-volatile semiconductor memory device as the eighth embodiment according to the present invention. FIG. 32A is a plan view for a low-voltage transistor, FIG. 32B is a sectional view taken along the line J–J' shown in FIG. 32A, FIG. 32C is a plan view for a high-voltage transistor, FIG. 32D is a sectional view taken along the line K–K' shown in FIG. 32C.

These transistor are fabricated in the same device and have the same structure in plan view. In the sectional views, both have a stacked-gate structure of a double-layer lower layer gate (layers 83 and 87 for low-voltage application and layers 83 and 97 for high-voltage application) like the charge-storage layer and an upper layer gate 88 made of a conductive material like the control gate. The upper layer of the lower layer gate for the low-voltage transistor is thicker than the counterpart of the high-voltage transistor. The low-voltage transistor has a thin gate oxide film 82 whereas the high-voltage transistor a thick gate oxide film 92.

Discussed below is the reason for these structures.

Sense-amplifies, voltage-boosters and input/output switching circuits generally include transistors each having a gate-insulating film of a specific thickness for a driving voltage. Sense-amplifies include a low-voltage transistor for a high-speed operation having a gate-insulating film of the same thickness as or thinner than a tunnel-insulating film of a memory cell. On the other hand, voltage-boosters for generating a high voltage for data reprogramming to memory cells and input/output switching circuits include a high-voltage transistor for a high-voltage operation having a gate-insulating film thicker than a tunnel-insulating film.

FIGS. 33A to 33F are sectional views each illustrating a step of manufacturing the low-voltage memory cell transistor of the non-volatile semiconductor memory device shown in FIGS. 32A and 32B. FIGS. 34A to 34F are sectional views each illustrating a step of manufacturing the high-voltage memory cell transistor of the non-volatile semiconductor memory device shown in FIGS. 32A and 32B.

Figure 33A:
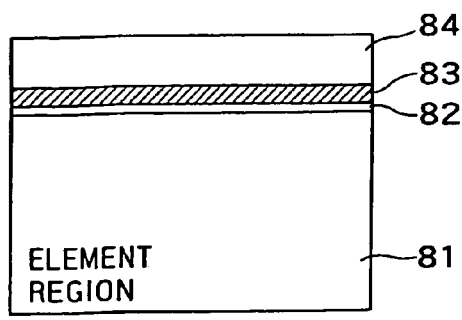
FIGS. 33A to 33F are sectional views each illustrating a step of manufacturing the low-voltage transistor.
Figure 33D:
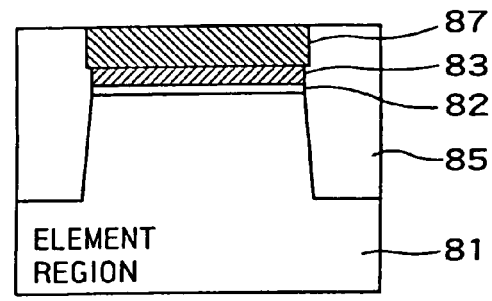
Figure 34A:
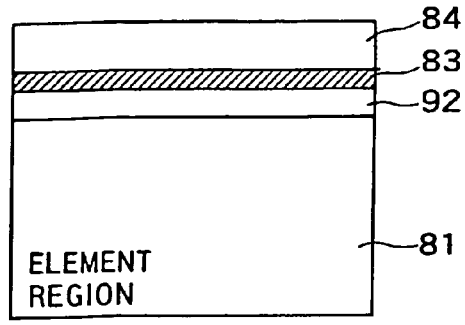
FIGS. 34A to 34F are sectional views each illustrating a step of manufacturing the high-withstand voltage transistor.

A plurality of gate insulating films of a specific thickness are formed on a semiconductor substrate 81. For example, a 100 A-thermal oxide film is formed as the tunnel-insulating film 82 for a memory cell made of the low-voltage transistor. Or, an 80 A-thermal oxide film 82 is formed as the thin gate insulating film for NMOS and PMOS for operating sense-amplifiers ( ). A 200 A-thermal oxide film 92 is formed as a thick gate-insulating film for a high-withstand voltage transistor for voltage boosting. A first conductive layer 83 and a masking material 84 are formed on the thermal oxide films (FIG. 33A, FIG. 34A).

Figure 33B:
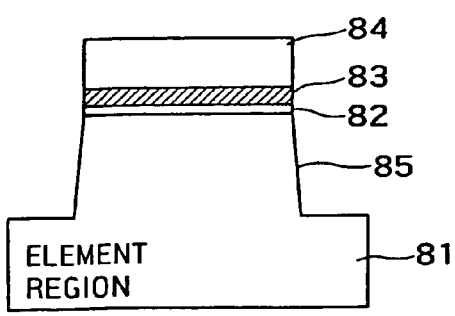
Figure 33E:
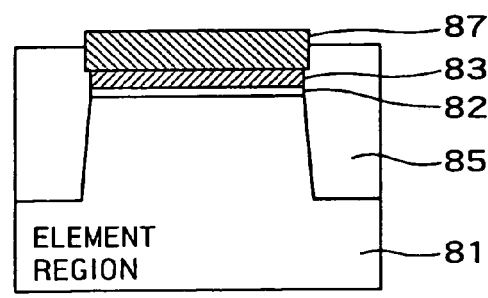
Figure 34B:
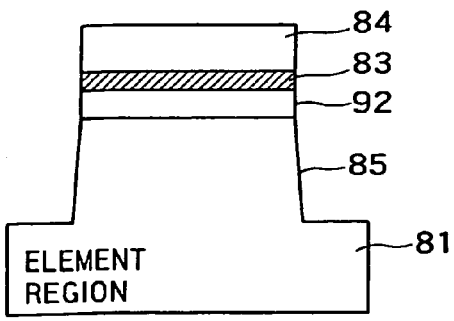
Figure 34C:
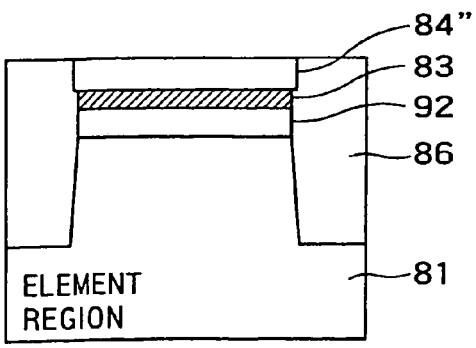
Figure 34D:
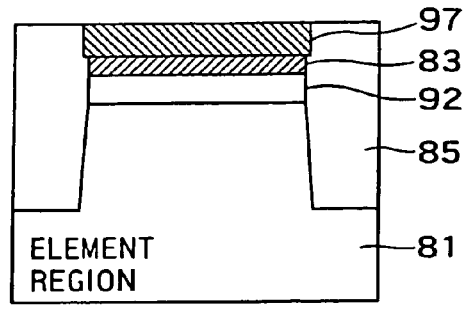
Figure 34E:
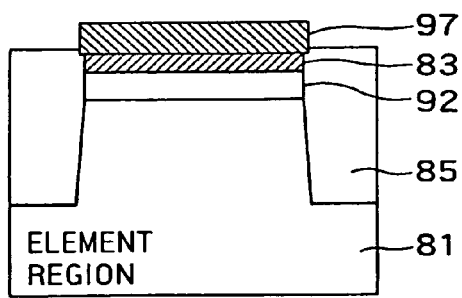
Figure 34F:
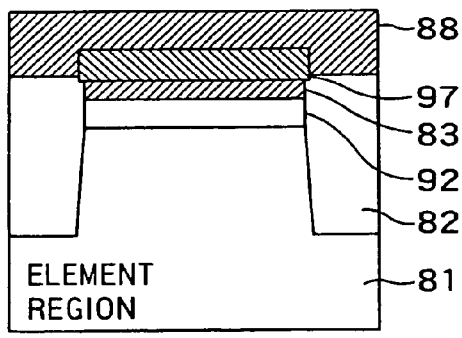
Figure 35A:
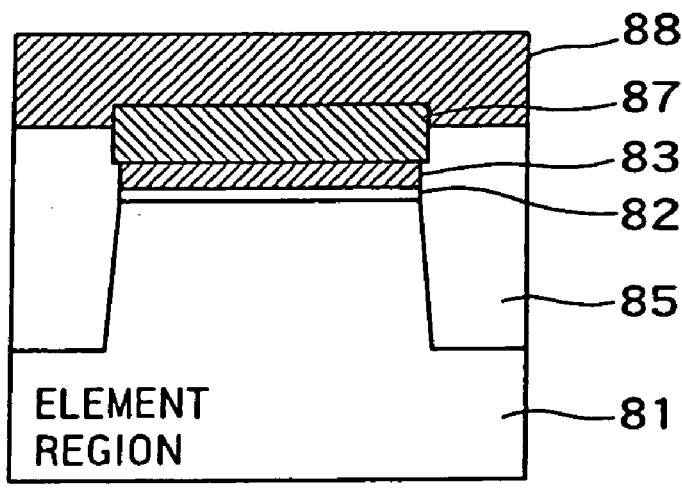
FIGS. 35A and 35B are sectional views illustrating modifications to the structures shown in FIGS. 32A to 32D, respectively.
Figure 35B:
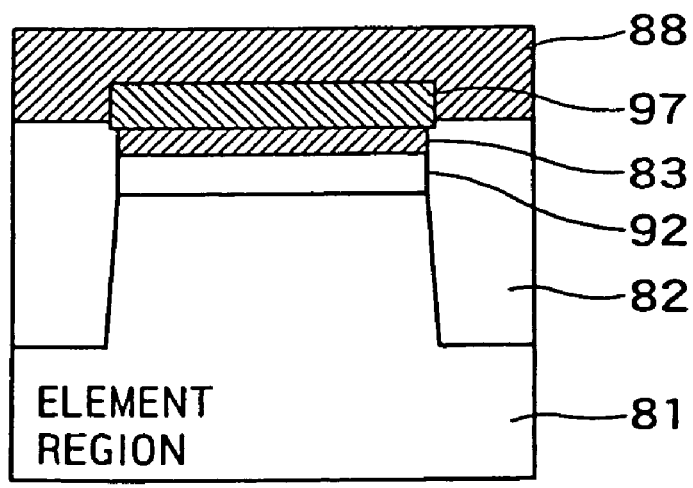

The masking material, the first conductive layer, the tunnel-insulating film of a plurality of films, the gate insulating film and the semiconductor substrate in the isolation region are removed so that their side walls are flush with each other to form trenches 85 (FIG. 33B, FIG. 34B).

Figure 33C:
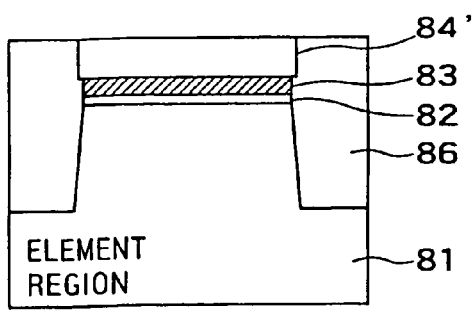
Figure 33F:
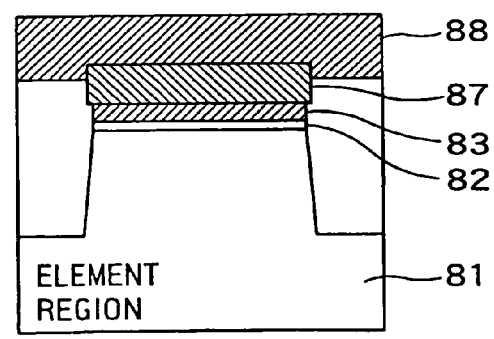

The side walls of the trenches 85 and the first conductive layers 83 are oxidized by oxidation with deposition of an isolation insulating film 86 thereon. The isolation insulating film 86 is flattened by etched-back in dry etching or polished by chemical-mechanical polishing (CMP), finally the upper surface of the masking material 84 being exposed (FIG. 33C). The height after etch-back for the low-voltage and the high-withstand voltage transistors are the same each other even though the thickness of the gate-insulating films are different therebetween, thus the thickness of the remaining masking materials are different as denoted by 84' and 84".

The masking material is peeled-off with deposition of the second conductive layer. The second conductive layer is etched back or polished to be flat until the isolation insulating film is exposed for isolation of the second conductive layer. The second conductive layers have different thickness as denoted by 87 for the low-voltage transistor and 97 for the high-withstand voltage transistor. A stacked structure of the first and the second conductive layers forms the chare-storage layer or the first gate electrode (FIGS. 12(*a*) and 12(*d*)).

An isolation insulating film 85 is etched back to expose a portion of the charge-storage layer (83, 87 and 97) and the fist gate electrode (82 and 92) (FIGS. 12(*b*) and 12(*e*)).

An ONO film, for example, is formed on the semiconductor substrate as a gate-to-gate insulating film. The ONO film is peeled off at least at a portion of the peripheral circuitry except the memory cell, followed by deposition of a control gate 88. The control gate is formed as the second gate electrode 88 for the transistor. The first and the second gate electrodes are electrically connected to each other to be at the same potential because the gate insulating film has been removed. Gate formation is performed so that the side walls of the memory cell and the transistor are flush with each other to finish fabrication of the cell and the transistor structures (FIGS. 12(c) and 12(f)).

The non-volatile semiconductor memory device in the fifth embodiment employs the same material for the gates of the memory cell and the transistor, thus easily achieving a low cost and high yields. A side-wall portion of the charge-storage layer is exposed over the chip with no lithography, thus the device being expected to be fabricated in low cost. The exposed height requires the step of peeling the gate-to-gate insulating film, thus resulting in that the transistor is higher than the memory cell. This would cause that the second conductive layer is thicker than that required for a memory cell. This could decrease yields in gate formation for memory cells arranged in high density.

A thin second conductive layer can be formed by lithography only for etch-back to the memory cell to expose a side-wall portion of the charge-storage layer. The charge-storage layer and the first gate electrode to be exposed are higher for the memory cell even the gate-to-gate insulating film is peeled off, thus achieving control of the thickness of the charge-storage layer with the thickness of the second conductive layer required for the memory cell.

FIG. 13 illustrates that the lower and the upper layers of the first gate electrode are flush with each other at their side faces by selection of appropriate requirements.

Having described several embodiments, it is believed obvious that modification and variation of the invention is possible in light of the above teaching.

The embodiments employ a two-layer electrode for the charge-storage layer, for example. This electrode can be of three layers or more, the highest and the lowest layers having the same structure and function of the upper and the lower layers, respectively, in the embodiments.

A silicon dioxide layer is used as the tunnel-insulating film for the first gate insulating film in the embodiments. However, it can be silicon nitride layer, silicon oxide/nitride layer or stacked film of any of these layers.

A silicon oxide film is used for the insulating film between the charge-storage layer and the control gate in the embodiments. However, it can be a nitride film, an oxide/nitride film or a stacked film of oxide and nitride films.

An impurity-doped polysilicon film is used for the control gate in the embodiments. However, it can be an amorphous silicon layer, a high-melting point-metallic material layer, such as, tungsten, a low-resistance-metallic layer, such as, aluminum, a stacked layer of a metallic silicide, such as, tungsten silicide (WSi) and a silicon material or a salicide film formed by depositing metal, such as, titanium on a silicon material with thermal annealing to cause a chemical reaction.

As for an isolation insulating film, other than silicon dioxide having a high aspect ratio for burying characteristics, for example, a doped-oxide film of PSG or BPSG including impurities, such as, phosphorus and boron or a stacked layer of them can be used.

The modification or variation of the invention can be applied to capacitors and resistors located other than the peripheral circuitry without departing from the spirit and scope the invention.

EFFECT OF THE INVENTION

According to the present invention, a non-volatile semiconductor memory device having STI structured-memory cells in which a charge-storage layer is formed with an isolation region, or a trench in self-alignment is formed as having a charge-storage layer of at least two stacked-layers, the first conductive layer being thin film for lowering an aspect ratio for burying an isolation insulating film, the second conductive film having thickness enough for attaining a desired capacity produced when facing the control gate. Thus, the present invention achieves a high-density and large-capacity non-volatile semiconductor memory device exhibiting a high data-reprogrammable characteristic that will be easily fabricated in low cost.

The second conductive layer is formed by a flattening process with an isolation insulating film as a stopper. Thus, the present invention achieves decrease in the number of fabrication steps by eliminating lithography for forming a charge-storage layer into slits on an isolation region required for a well-known n on-volatile semiconductor memory device.

What is claimed is:

1. A method of manufacturing a non-volatile semiconductor memory device, comprising:
    depositing a first gate material layer via a first gate insulating film on a semiconductor substrate;
    forming a masking material for isolation in pattern on the first gate material layer;
    forming an isolation trench so as to define device forming regions continuous in a first direction at a predetermined interval in a second direction orthogonal to the first direction by etching the first gate material layer and the semiconductor substrate by use of the masking material;
    embedding an isolation insulating film into the isolation trench so as to be substantially flush with the masking material;
    forming in pattern, on the isolation insulating film, a stacked layer of a protective insulating film for protecting the isolation insulating film and a gate embedding-oriented insulating film so as to be continuous in the first direction;
    removing the masking material by etching with the stacked layer serving as a mask;
    forming a charge-storage layer having a stacked layer structure of the first gate material layer and a second gate material layer by depositing the second gate material layer and polishing the surface thereof, the charge-storage layer being isolated on the isolation insulating film by the stacked layer;
    depositing, after removing the gate embedding-oriented insulating film on the isolation insulating film, a third gate material layer via the second gate insulating film on the charge-storage layer and the protective insulating film; and
    forming in pattern the control gate continuous in the second direction and the charge-storage layer self-aligned with the control gate and isolated in the first direction by sequentially etching the third gate material layer, the second gate insulating film and the charge-storage layer.

2. The method of claim 1, wherein said embedding an isolation insulating film into the isolation trench is performed by depositing the isolation insulating film material on the whole device and flattening by a chemical mechanical polishing (CMP).

3. The method of claim 1, wherein said first and second gate materials are poly silicon.

4. The method of claim 1, wherein said third gate material is a poly silicon film.

5. The method of claim 1, wherein said third gate is a stacked film of a poly silicon film and metal film.

6. The method of claim 1, wherein said third gate material is a metal silicide film.

7. The method of claim 1, wherein said third gate material is a self-aligned silicide (salicide) film.

8. The method of claim 1, wherein said first gate insulating film is a tunnel insulating film.

9. The method of claim 1, wherein said second gate insulating film is ONO film.

* * * * *